United States Patent [19]

Johnson et al.

[11] 4,359,771

[45] Nov. 16, 1982

[54] METHOD AND APPARATUS FOR TESTING AND VERIFYING THE OPERATION OF ERROR CONTROL APPARATUS WITHIN A MEMORY

[75] Inventors: Robert B. Johnson, Billerica; Chester M. Nibby, Jr., Peabody, both of Mass.

[73] Assignee: Honeywell Information Systems Inc., Waltham, Mass.

[21] Appl. No.: 172,486

[22] Filed: Jul. 25, 1980

[51] Int. Cl.[3] .............................................. G06F 11/10
[52] U.S. Cl. .................................... 371/13; 364/900; 371/38; 371/3
[58] Field of Search ................... 371/13, 3, 15, 16, 38; 364/200, 900

[56] References Cited

U.S. PATENT DOCUMENTS

| | | | |
|---|---|---|---|
| 3,405,258 | 10/1968 | Godoy et al. | 371/3 |
| 3,465,132 | 9/1969 | Crockett et al. | 371/3 |
| 3,814,920 | 6/1974 | Huelters | 371/25 |
| 4,072,853 | 2/1978 | Barlow et al. | 371/38 |
| 4,175,692 | 11/1979 | Watanahe | 371/38 |
| 4,183,096 | 1/1980 | Cenker et al. | 365/222 |
| 4,216,541 | 8/1980 | Clover et al. | 371/38 |
| 4,255,808 | 3/1981 | Schaber | 371/38 |

OTHER PUBLICATIONS

Irwin, Data Rate Changing for Diagnostic Purposes, IBM Technical Disclosure Bulletin, vol. 14, No. 11, Apr. 1972, pp. 3387-3388.

*Primary Examiner*—Charles E. Atkinson
*Attorney, Agent, or Firm*—Faith F. Driscoll; Nicholas Prasinos

[57] ABSTRACT

Soft error rewrite control apparatus is included within a memory system for rendering the semiconductor memory modules less susceptible to single bit errors produced by alpha particles and other system disturbances. During a number of successive memory cycles occurring at a predetermined rate, the soft error rewrite control apparatus enables the read out of information stored within each module location, the correction of any single bit errors contained therein and the rewriting of the corrected information back into such location. Diagnostic apparatus is further included which is connected to place the memory system in a state for testing and verifying the operation of the soft error control apparatus. Also, the diagnostic apparatus is connected to condition the soft error control apparatus for operating in a high speed mode enabling the read out correction and rewriting of each location to take place within a minimum amount of time. By monitoring the status of the information being corrected, the diagnostic apparatus is able to signal whether or not the soft error control apparatus is operating properly.

40 Claims, 11 Drawing Figures

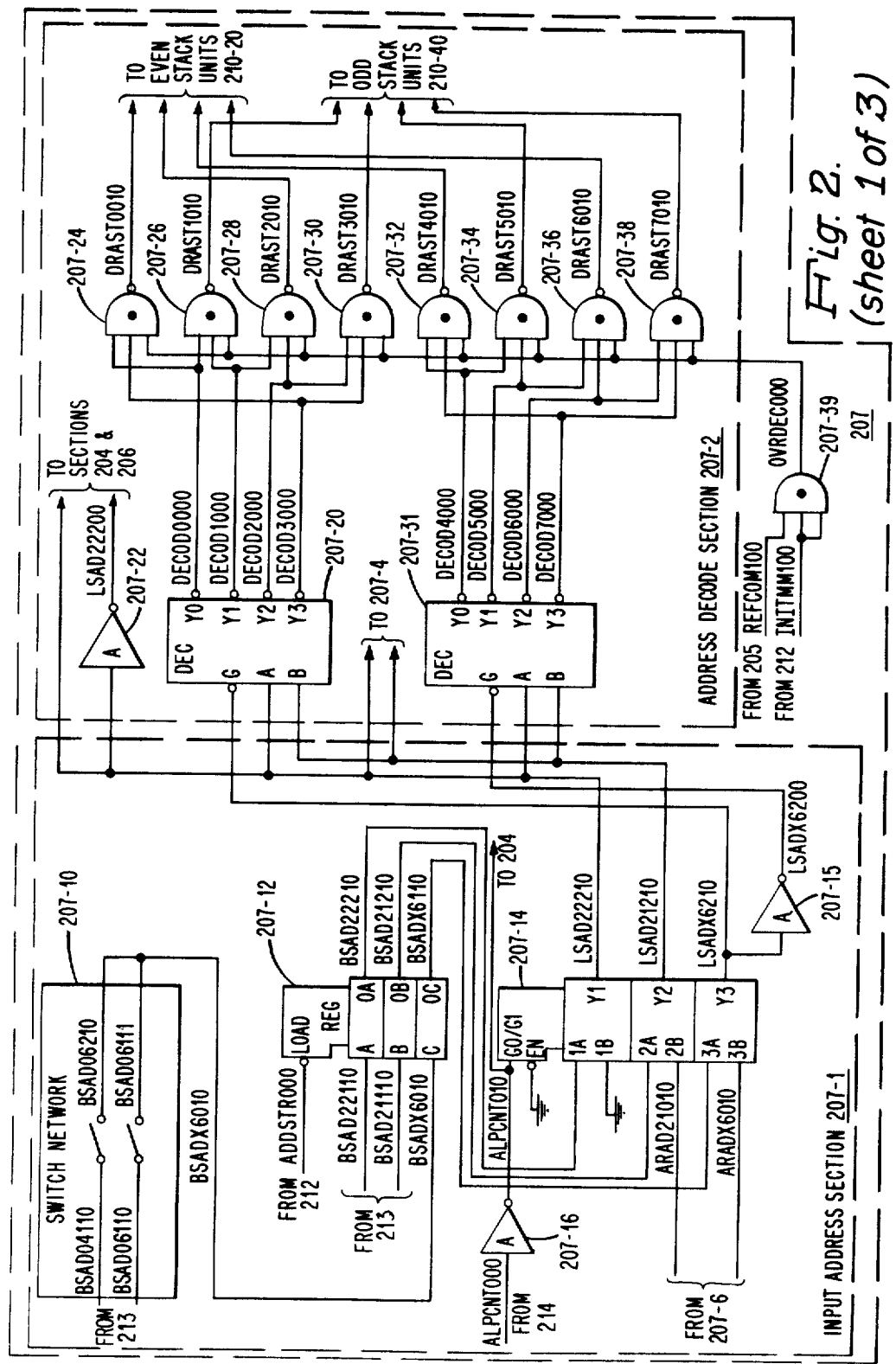
Fig. 2. (sheet 1 of 3)

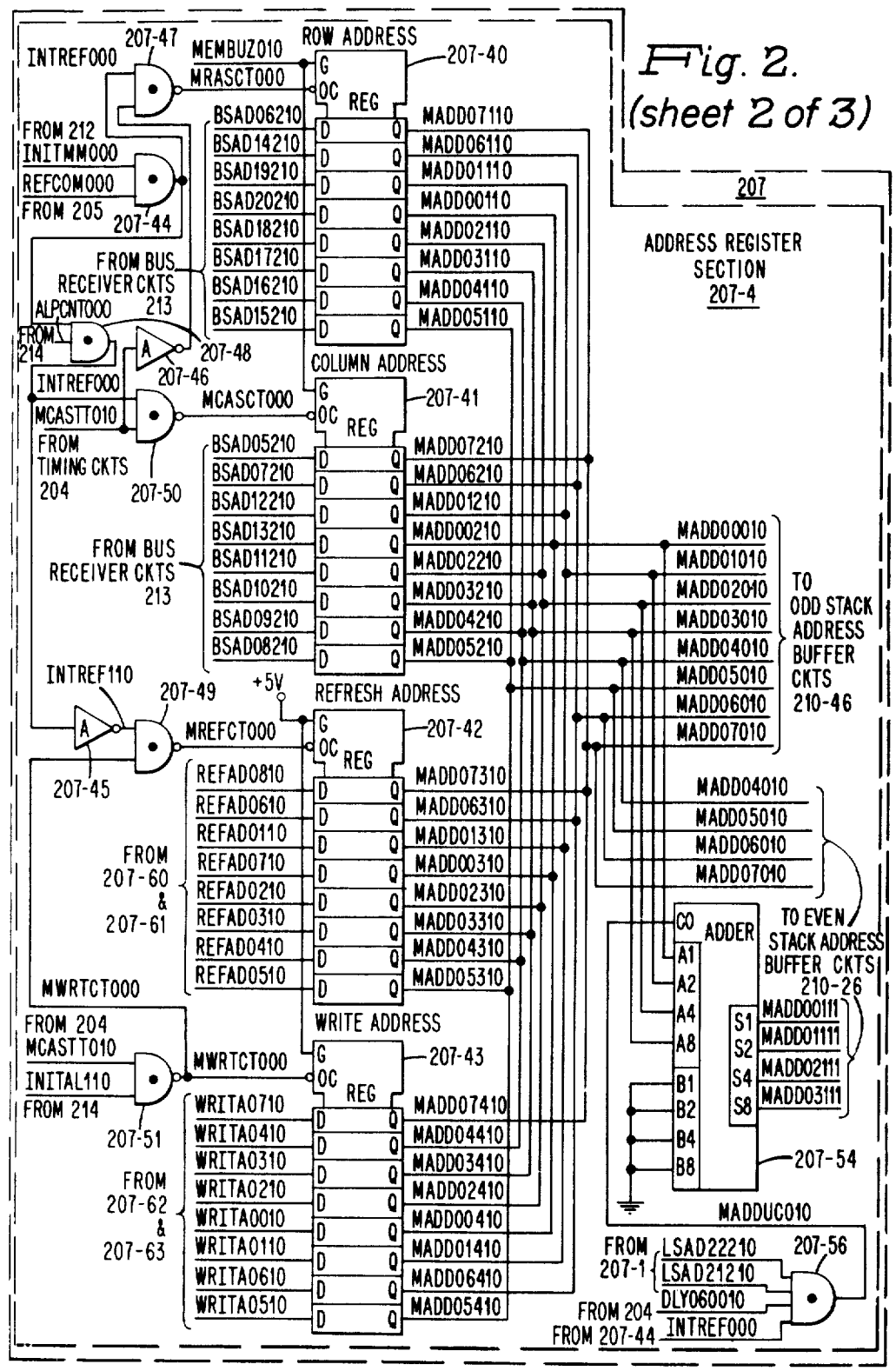
Fig. 2. (sheet 2 of 3)

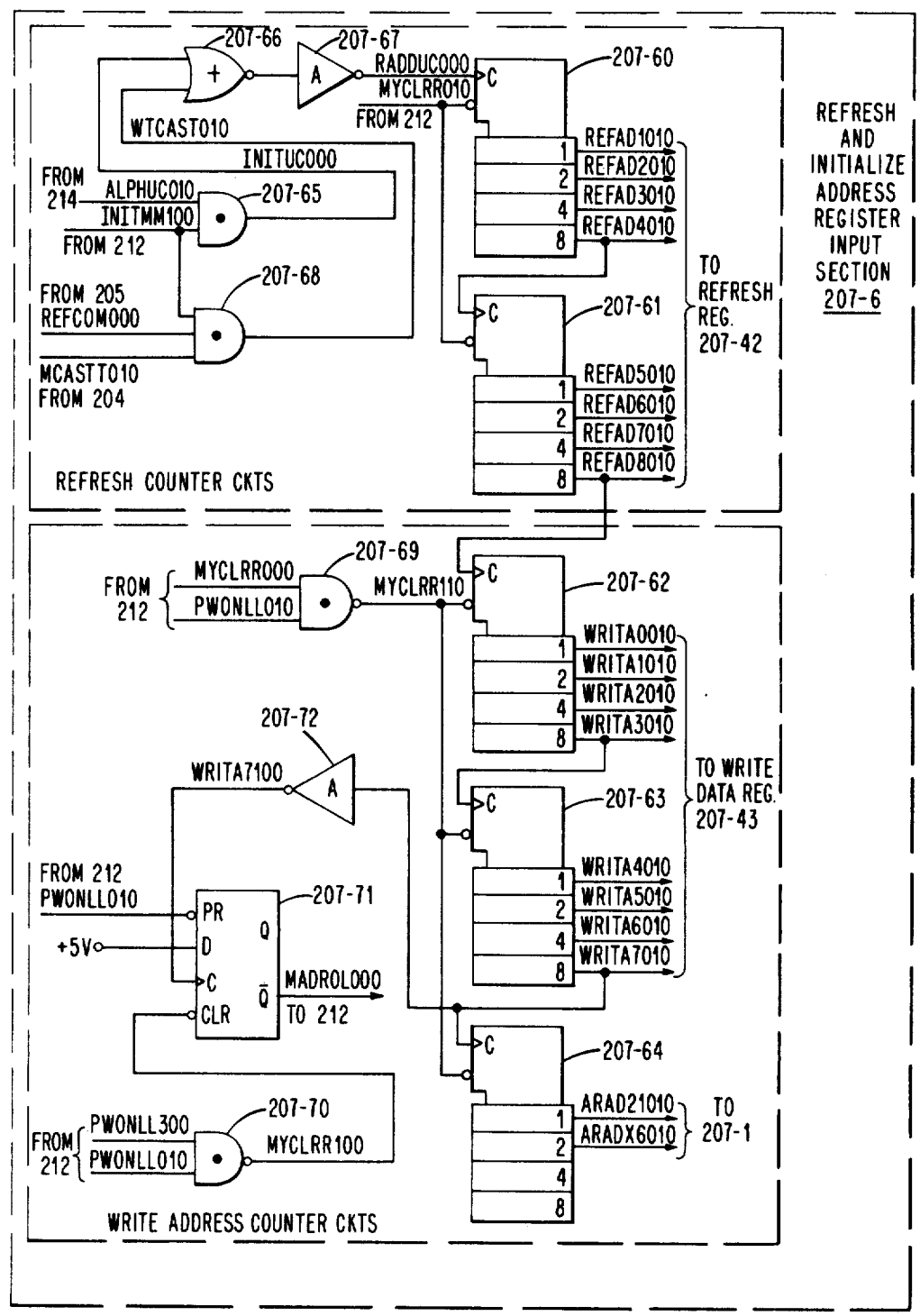
Fig. 2. (sheet 3 of 3)

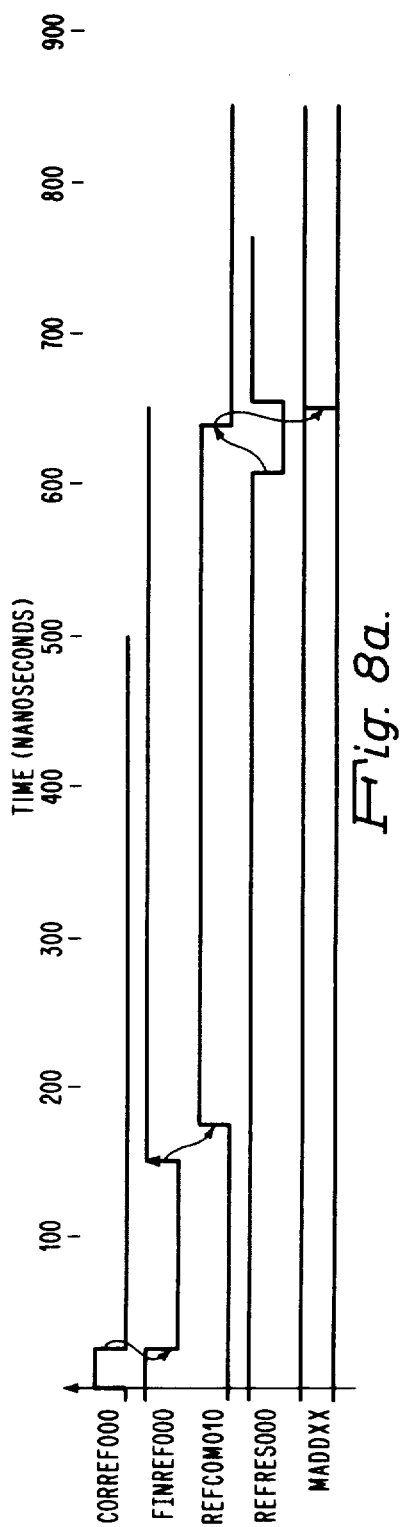

DIAGNOSTIC MODES

ADDRESS BITS 19, 20, 21: 010 = SET EDAC MODE
           011 = RESET EDAC MODE
           110 = SOFT ERROR CONTROL

IF BIT 19, 20, 21 = 110 THEN:

1. B = BIT 15 = BYPASS SOFT ERROR CONTROL
 WHEREIN BIT 15 = 0 - SOFT ERROR CONTROL ON
      & BIT 15 = 1 - SOFT ERROR CONTROL OFF

2. S = BIT 14 = SPEED OF SOFT ERROR CONTROL
 WHEREIN BIT 14 = 0 - NORMAL MODE
      & BIT 14 = 1 - HIGH SPEED TEST & VERIFICATION MODE

METHOD AND APPARATUS FOR TESTING AND VERIFYING THE OPERATION OF ERROR CONTROL APPARATUS WITHIN A MEMORY

RELATED APPLICATIONS

1. "Soft Error Control System" invented by Robert B. Johnson and Chester M. Nibby, Jr., filed on even date herewith and assigned to the same assignee as named herein.

BACKGROUND OF THE INVENTION

1. Field of Use

This invention relates to diagnostic apparatus and more particularly to apparatus for testing and verifying the operation of apparatus associated with the semiconductor memory modules of a memory system.

It has become well known to construct memory systems comprising a plurality of memory modules from arrays of metal oxide semiconductor (MOS) chips. Such chips require periodic refreshing of the charges stored therein to prevent the loss of information. Similarly, read or write operations involve alterations of the stored changes representative of information. In order to increase the reliability of such memory systems, it is well known to include in such systems error detection and correction apparatus for detecting and correcting errors within such semiconductor modules.

Recently, manufacturers of such MOS dynamic random access memory chips have noted that high density memory chips lack immunity to soft errors resulting from ionizing alpha particles. To overcome this problem, some manufacturers have improved the structures of the chips so as to provide a high degree of immunity to soft errors. While this approach reduces the likeliness of such soft errors, such errors still can occur which can give rise to uncorrectable error conditions.

This type of problem has been overcome by including soft error rewrite hardware apparatus in a MOS dynamic memory system which in conjunction with the refresh utilization circuits and error detection and correction (EDAC) circuits of the dynamic memory system writes corrected versions of the information read out from each location at a predetermined rate. The additional apparatus includes counter control circuits which are synchronized from the same timing source which synchronizes the refresh and initialize address counter circuits. The counter control circuits count with a modulus one less than a maximum count for generating a sequence of counts at which enable the selection of row and column addresses for rewriting all of the locations with error free information during a corresponding number of cycles of operation at the predetermined rate. The predetermined rate is selected to be much slower than the refresh rate so as to minimize interference with normal memory operations.

This additional apparatus is the subject of the copending patent application of Robert B. Johnson and Chester M. Nibby, Jr. tilted "Soft Error Rewrite Control System" referenced as a related application herein. For further information regarding this apparatus, reference may be made to this application.

2. Prior Art

In such systems, it becomes essential to ensure through the use of checking and diagnostic procedures that each portion of the memory system is operating properly. A very important aspect of such procedures involves the checking and verification of such error detection and correction apparatus in addition to any other apparatus included within the memory system for increased reliability.

Because of the increase in the complexity of the memory system that it has become desirable to include circuits within the system which facilitate the verification of the proper operation of the different portions of the memory system under the control of a data processing unit. One such arrangement, invented by Chester M. Nibby, Jr. et al, is described in U.S. Pat. No. 3,814,922 which is assigned to the same assignee as named herein.

The arrangement of U.S. Pat. No. 3,814,922 includes a maintenance status register and associated apparatus for manipulation and storing of information involving errors detected in the memory module associated with a data processing unit. Errors detected in the memory module are entered in prescribed positions of the maintenance status register. The presence and nature of a detected error is signalled to the data processing unit, which responds in a manner appropriate to the nature of the error. The data processing unit has access to the contents of the maintenance status register in order to localize the malfunction and determine the availability of the memory module.

Another mode of operation is provided for checking the logic circuits associated with the apparatus for refreshing the volatile data contained in the memory elements. The operation of the logic circuit is verified under control of the data processing unit.

It is seen that the above arrangement enables verification of logic circuits which control the operations of a memory module during different modes of operation. However, there is no provision for directly verifying apparatus which is used for enhancing the reliability of memory module operations.

Accordingly, it is a primary object of the present invention to provide apparatus for verifying the operation of soft error hardware apparatus associated with the memory modules of a memory system.

It is a more specific object of the present invention to provide apparatus for verifying the operation of soft error control apparatus within a minimum of time and with the introduction of a minimum of additional apparatus.

SUMMARY OF THE INVENTION

The above objects are achieved in a preferred embodiment of the present invention which include soft error control apparatus in an MOS dynamic memory system. The soft error rewrite control apparatus, in conjunction with the error detection and correction (EDAC) circuits of the dynamic memory system, writes corrected versions of the information read out from each location within a number of memory modules included within the system at a predetermined rate. The predetermined rate is selected to be much slower than the rate at which the memory modules are refreshed so as to minimize interference with normal memory operations.

In accordance with the teachings of the present invention, diagnostic apparatus is included within the system which connects to the EDAC circuits and soft error rewrite control apparatus. The diagnostic apparatus includes means for placing the memory modules in a state for testing and verifying the operation of the soft error control apparatus. Additionally, the diagnostic apparatus includes mode control apparatus which connects to the soft error control apparatus for enabling operation in a high speed mode. This permits the read out, correction and rewriting operations performed upon locations under the control of the soft error rewrite control apparatus to take place within a minimum of time. In the preferred embodiment, the operations performed upon locations take place following each refresh cycle of operation.

By monitoring the status of the information being checked and corrected, the diagnostic apparatus utilizing the error signalling circuits included within the memory system is able to establish whether or not the soft error rewrite control apparatus is operating properly.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIG. 2 discloses in greater detail the timing circuits of block 207 of FIG. 1.

FIGS. 8a and 8b are timing diagrams used to explain the operation of the present invention.

MEMORY SUBSYSTEM INTERFACE

Figure 1:
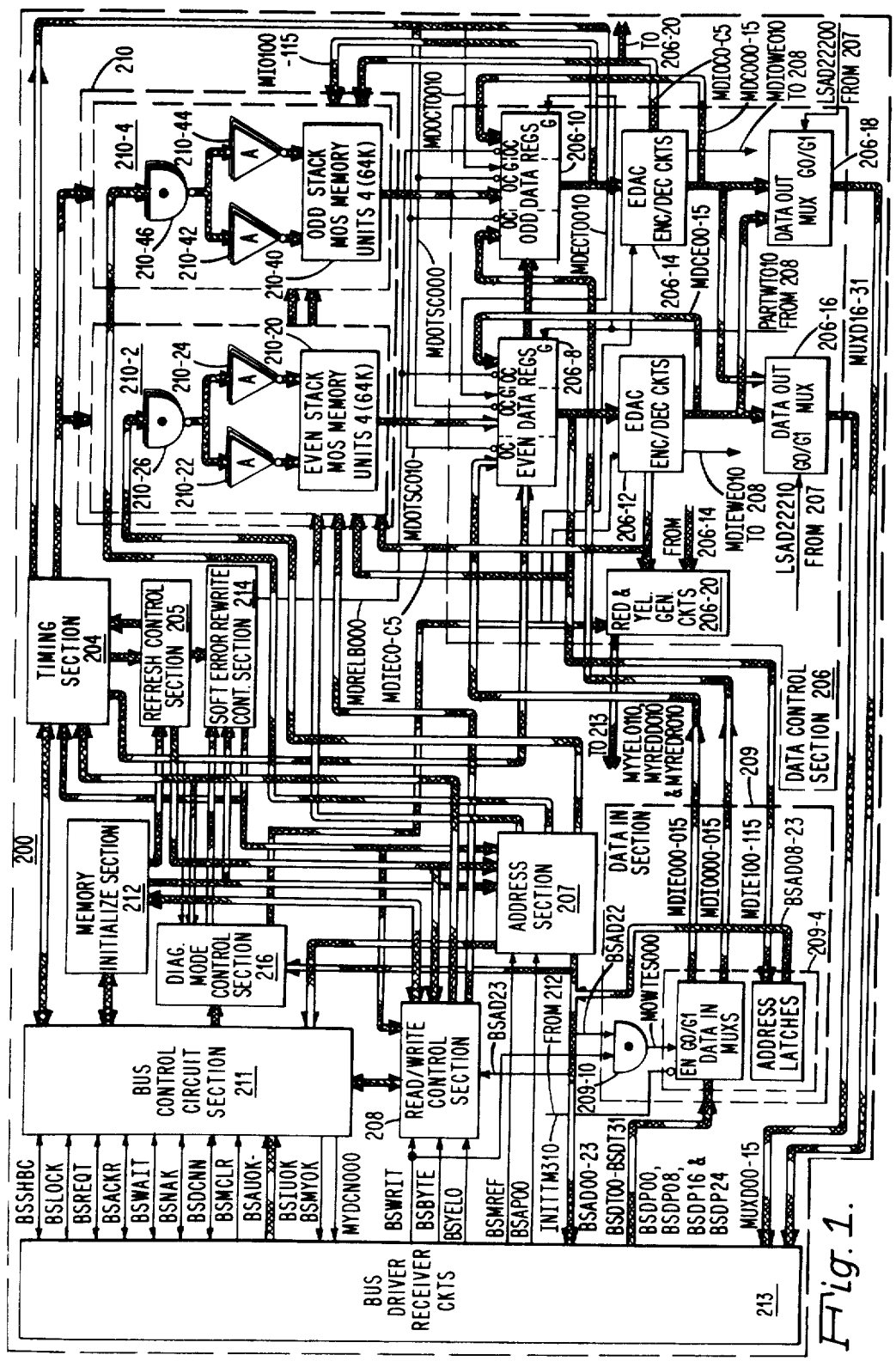
FIG. 1 is a block diagram of a dynamic memory system which incorporates the apparatus of the present invention.

Before describing the controller of FIG. 1, it is seen that there are a number of lines which constitute the interface between the controller and a bus. As shown, the interface lines include a number of address lines (BSAD00-23, BSAP00), two sets of data lines (BSDT00-15, BSDP00, BSDP08) and (BSDT16-31, BSDP16, BSDP24), a number of control lines (BSMREF-BSMCLR), a number of timing lines (BSREQT-BSNAKR), and a number of tie breaking network lines (BSAUOK-BSIUOK, BSMYOK).

The description of the above interface lines are given in greater detail in the section to follow.

| MEMORY SUBSYSTEM INTERFACE LINES | |
|---|---|
| Designation | Description |
| | Address Lines |
| BSAD00-BSAD23 | The bus address lines constitute a twenty-four bit wide path used in conjunction with the bus memory reference line BSMREF to transfer a 24-bit address to controller 200 or a 16-bit identifier from controller 200 to the bus (for receipt by a slave unit). When used for memory addressing, the signals applied to lines BSAD00-BSAD03 select a particular 512K word module, the signals applied to lines BSAD04-0BBSAD22 select one of the 512K words in the module while the signal applied to line BSAD23 selects one of the bytes within the selected word (i.e., BSAD23=1=right byte; BSAD23=0=left byte). When used for identification, lines BSAD00-BSAD07 are not used. The lines BSAD08-BSAD23 carry the identification of the receiving unit as transmitted to controller 200 during the previous memory read request. |
| BSAP00 | The bus address parity line is a bidirectional line which provides an odd parity signal for the address signals applied to lines BSAD00-BSAD07. |
| | Data Lines |
| BSDT00-BSDT15, BSDT16-BSDT31 | The sets of bus data lines constitute a 32-bit or two word wide bidirectional path for transferring data or identification information between controller 200 and the bus as a function of the cycle of operation being performed. During a write cycle of operation, the bus data lines transfer information to be written into memory at the location specified by the address signals applied to lines BSAD00-BSAD23. During the first half of a read cycle of operation, the data lines BSDT00-BSDT15 transfer identification information (channel number) to the controller 200. During the second half of the read cycle, the data lines transfer the information read from memory. |
| BSDP00, BSDP08, BSDP16, BSDP24 | The bus data parity lines are two sets of bidirectional lines which provide odd parity signals coded as follows: BSDP00=odd parity for signals applied to lines BSDT00-BSDT06 (left byte); BSDP08=odd parity for signals applied to lines BSDT08-BSDT15 (right byte); BSDP16 =odd parity for signals applied to lines BSDT16-BSDT23; and BSDP24=odd parity signals applied to lines BSDT24-BSDT31. |
| | Control Lines |
| BSMREF | The bus memory reference lines extends from the bus to the memory controller 200. When set to a true state, this line signals the controller 200 that the lines BSAD00-BSAD23 contain a complete memory controller address and that it is performing a write or read operation upon the specified location. When rest to a false start, the line signals controller 200 that the lines BSAD00-BSAD23 contain information directed to another unit and not controller 200. |
| BSWRIT | The bus write line extends from the bus to the memory controller 200. This line when set to a true state, in conjunction with line BSMREF being true, signals controller 200 to perform a write cycle of operation. When reset to a false state, this line, in |

MEMORY SUBSYSTEM INTERFACE LINES

| Designation | Description |
|---|---|
| | conjunction with line BSMREF being true, signals controller 200 to perform a read cycle of operation. |
| BSBYTE | The buse byte line extends from the bus to controller 200. This line, when set to a true state, signals controller 200 that it is to perform a byte operation rather than a word operation. |
| BSLOCK | The bus lock extends from the bus to controller 200. When set to a true state, this line signals controller 200 of a request to perform a test or change the status of a memory lock flip-flop included within the controller 200. |
| BSSHBC | The bus second half bus cycle line is used to signal a unit that the current information applied to the bus by controller 200 is the information requested by a previous read request. In this case, both controller 200 and the unit receiving the information are busy to all units from the start of the initiation cycle until controller 200 completes the transfer. This line is used in conjunction with the BSLOCK line to set or reset its memory lock flip-flop. When a unit is requesting to read or write and line BSLOCK is true, the line BSSHBC, when true, signals controller 200 to reset its lock flip-flop. When in a false state, it signals controller 200 to test and set its lock flip-flop. |
| BSMCLR | The bus master clear line extends from the bus to controller 200. When this line is set to a true state, it causes the controller 200 to clear the zeros certain bus circuits within controller 200. |
| BSREDD | The red left line extends from controller 200 to the bus. When set to a true state in response to a read command, this line signals that an uncorrectable error is contained in the leftmost word of the pair of word being returned. If only one word is being returned, it is considered the leftmost word. |
| BSREDR | The bus red right line extends from controller 200 to the bus. When set to a true state in response to a read command, this line signals that an uncorrectable error is contained in the rightmost word of the pair of words being returned. |
| BSYELO | The bus yellow line is a bidirectional line which designates a soft error condition. When set to a true state during the second half of a bus cycle in response to a read command, it indicates that the accompanied transferred information has been successfully corrected. When set to a true state during a memory read request, this line indicates that the read request is to be interpreted as a diagnostic command. |
| | Bus Handshake/Timing Lines |
| BSREQT | The bus request line is a bidirectional line which extends between the bus and controller 200. When set to a true state, it signals the controller 200 that another unit is requesting a bus cycle. When reset to a false state, it signals controller 200 that there is no bus pending bus request. This line is forced to a true state by |

MEMORY SUBSYSTEM INTERFACE LINES

| Designation | Description |
|---|---|
| | controlller 200 to request a read second half bus cycle. |
| BSDCNN | The data cycle line is a bidirectional line which extends between the bus and controller 200. When forced to a true state, the line signals the controller 200 that a unit was granted a requested bus cycle and placed information on the bus for another unit. The controller 200 forces the line to a true state to signal that it is transmitting requested data back to a unit. Prior to this, controller 200 had requested and been granted a bus cycle. |
| BSACKR | The bus acknowledge line is a bidirectional line which extends between the bus and controller 200. When set to a binary ONE by controller 200, the line signals that it is accepting a bus transfer during a read first half bus cycle or write cycle. During a read second half bus cycle, this line when set to a binary ONE by the unit which originated the request signals the controller 200 of its acceptance of a transfer. |
| BSWAIT | The bus wait line is a bidirectional line which extends between the bus and controller 200. When set to a true or binary ONE state by controller 200, it signals a requesting unit that the controller cannot accept a transfer at this time. Thereafter, the unit will initiate successive retries until the controller 200 acknowledges the transfer. The controller 200 sets the BSWAIT line true under the following conditions:<br>1. It is busy performing an internal read or write cycle of operation.<br>2. It is requesting a read second half bus cycle.<br>3. It is anticipating a refresh operation.<br>4. It is performing a refresh operation.<br>5. It is busy when placed in an initialize mode.<br>6. It is busy performing a soft error rewrite cycle.<br>When the BSWAIT line is set to a true or binary ONE state by a unit, this signals the controller 200 that the data is not being accepted by the requesting unit and to terminate its present bus cycle of operation. |
| BSNAKR | The bus negative acknowledge line is a bidirectional line which extends between the bus and controller 200. When this line is set to a true or binary ONE state by controller 200, it signals that it is refusing a specified transfer. The controller 200 sets line BSNAKR to a true state as follows:<br>1. Memory lock flip-flop is set to a binary ONE, and<br>2. The request is to test and set the lock flip-flop (BSLOCK true and BSSHBC false).<br>In all other cases, when the memory lock flip-flop is set, controller 200 generates a response via the BSACKR line or the BSWAIT line or generates no response.<br>When the BSNAKR line is forced true by a unit, this signals controller 200 that the data is not accepted by the |

| | -continued |
|---|---|
| MEMORY SUBSYSTEM INTERFACE LINES | |
| Designation | Description |
| | unit and to terminate its cycle of operation. |
| | Tie Breaking Control Lines |
| BSAUOK-BSIUOK | The tie breaking network lines extend from the bus to controller 200. These lines signal controller 200 whether units of higher priority have made bus requests. When all the signals on these lines are binary ONES, this signals controller 200 that it has been granted a bus cycle at which time it is able to force the BSDCNN line to a binary ONE. When any one of the signals on the lines is a binary ZERO, this signals controller 200 that it has not been granted a bus cycle and is inhibited from forcing line BSDCNN to a binary ONE. |
| BSMYOK | The tie breaking network line extends from controller 200 to the bus. Controller 200 forces this line to a false or binary ZERO state to signal other units of lower priority of a bus request. |

General Description of the System of FIG. 1

FIG. 1 shows a preferred embodiment of a memory controller 200 which is constructed using the principles of the present invention. Referring to FIG. 1, it is seen that the controller 200 controls the two 256 K word memory module units 210-2 and 210-4 of memory section 210. The module units of blocks 210-2 and 210-4 include high speed MOS random access memory integrated circuits corresponding to blocks 210-20 and 210-40, and address buffer circuits corresponding to blocks 210-22 through 210-26 and 210-42 through 210-46. Each 256 K memory unit is constructed from 64 K word by 1-bit dynamic MOS RAM chips illustrated in greater detail in FIG. 7. More specifically, referring to FIG. 7, it is seen that each 256 K by 22-bit memory module includes 88, 65,534 (64 K) word by 1-bit chips. Within each chip there are a number of storage arrays organized in a matrix of 256 rows by 256 columns of storage cells.

The controller 200 includes those circuits required to generate memory timing signals, perform refresh operation, soft error rewrite control operations, data transfer operations, address distribution and decoding operations and bus interface operations. Such circuits are included as part of the different sections of FIG. 1.

The sections include a timing section 204, a refresh control section 205, a soft error rewrite control section 214, a data control section 206, an address section 207, a read/write control section 208, a data in section 209, a bus control circuit section 211, a memory initialize circuit section 212, bus driver/receiver circuit section 213, and a diagnostic mode control section 216.

The bus control section 211 includes the logic circuits which generate signals for generating and accepting bus cycle request for single and double word operation. As seen from FIG. 1, these circuits as well as the circuits of the other sections are connected to the bus via the driver/receiver circuits of section 213 which are conventional in design. The section 211 includes the tie breaking network circuits which resolve request priority on the basis of a unit's physical position on the bus. The memory controller, located at the left most or bottom position of the bus, is assigned the highest priority while a central processing unit (CPU), located at the highest most or top position of the bus is assigned the lowest priority. For further information regarding bus operation, reference may be made to U.S. Pat. No. 4,000,485 which issued Dec. 28, 1976.

Figure 3:
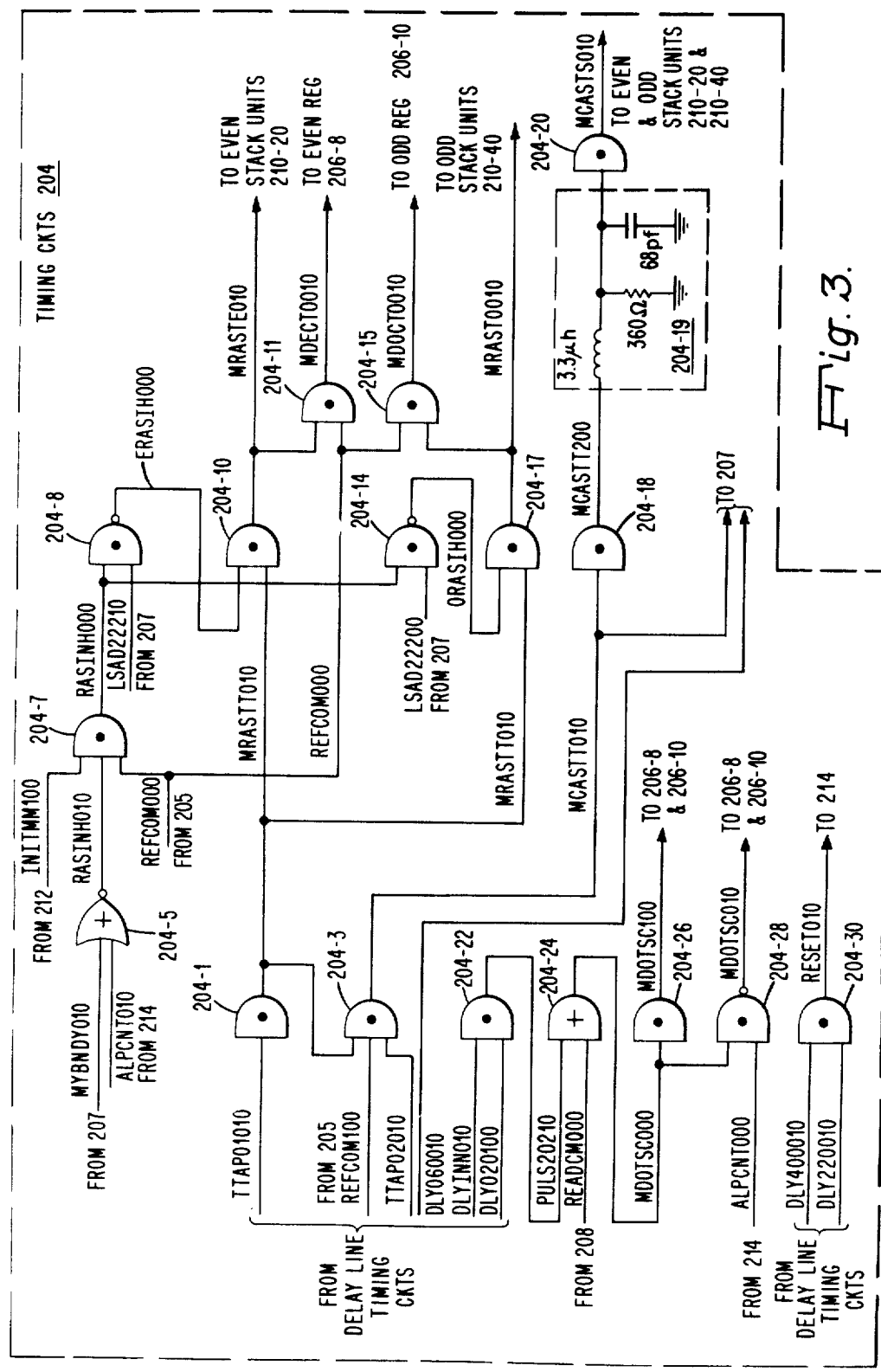
FIG. 3 discloses in greater detail the timing circuits of block 204 of FIG. 1.

The timing section 204, shown in detail in FIG. 3, includes circuits which generate the required sequence of timing signals from memory read and write cycles of operation. As seen from FIG. 1, this section transmits and receives signals to and from sections 205, 206, 207, 208, 211-214, and 216.

The address section 207, shown in greater detail in FIGS. 2a through 2c, includes circuits which decode, generate and distribute address signals required for refresh operations, initialization and read/write selection. The section 207 receives address signals from lines BSAD08-BSAD23 and address lines BSAD00-BSAD07 and BSAP00 in addition to the memory reference control signal from the BSMREF line. Additionally, section 207 receives control and timing signals from sections 204, 212, and 205.

The memory initialization section 212 includes circuits, conventional in design, for clearing the controller circuits to initial or predetermined state. For further information regarding this section, reference may be made to the related patent application of Robert B. Johnson and Chester M. Nibby, Jr. referenced herein.

The read/write control section 208 includes register and control logic circuits, conventional in design. The register circuits receive and store signals corresponding to the states of the BSWRIT, BSBYTE and the address line BSAD23. The control circuits decode the signals from the register circuits and generate signals which are applied to sections 204, 207 and 210 for establishing whether the controller is to perform the read, write or read followed by a write cycle of operation (i.e., for a byte command).

The refresh section 205 includes the circuits for periodically refreshing the contents of the memory. Section 205 receives timing and control signals from section 204 and provides refresh command control signals to sections 204, 207, 208, and 212. For further details, reference may be made to U.S. Pat. No. 4,185,323 which discloses circuits for generating refresh command (REFCOM) signals.

The data in section 209 circuits of block 209-4 include a pair of multiplexer circuits and an address register which is connected to receive signals from section 206.

The multiplexer circuits, conventional in design, receive data words from the two sets of bus lines BSDT00-15 and BSDT16-31 and apply the appropriate words via the sets of output lines MDIE000-015 and MDIO000-015 to the correct memory modules during a write cycle of operation. That is, multiplexer circuits are selectively enabled by signal MOWTES000 generated by an AND gate 209-10 when initialize signal INITTM310 from 212 is a binary ZERO (i.e., not in an initialize mode). The AND gate 209-10 generates signal MOWTES000 as a function of bus address bit 22 (i.e., signal BSAD22) and whether the controller is doing a write operation (i.e., signal BSWRIT). During a write operation, signal MOWTES000 selects the correct data word (i.e., the word applied to bus lines BSDT00-15 or BSDT16-31) to be applied to the correct memory unit. This enables a write operation to start on any word boundary.

During a read operation, the multiplexer circuits are conditioned to apply the module identification information received from the bus lines BSDT00-15 back to the address bus lines BSAD08-23. This is done by loading the signals applied to lines BSDT00-15 into the even data register 206-8 of section 206. This, in turn, causes the address register latches of block 209-4 to be with the module identification information transmitted via the bus lines BSDT00-15. Since this is not pertinent to an understanding of the present invention, it will not be further discussed herein.

The data control section 206 includes three tristate operated data registers 206-8 and 206-10, multiplexer circuits 206-16 and 206-18 with associated control circuits which enable data to be written into and/or read from the even and odd memory units 210-20 and 210-40 of section 210 and red and yellow generator circuits of block 206-20. For example, during a double wide read cycle operation, operand or instruction signals are read out from the units 210-20 and 210-40 into the even and odd output registers 206-8 and 206-10. During a write cycle of operation, the byte operand signals are loaded into the left most section of the pair of registers 206-8 and 206-10 from the bus via section 209-4 and written into the odd or even unit of section 210.

The controller 200 includes error detection and correction (EDAC) apparatus wherein each word contains 16 data bits and 6 check bits used to detect and correct single bit errors in the data words and detect and signal without correction, double bit errors in the data word. The EDAC apparatus includes two sets of EDAC encoder/decoder circuits 206-12 and 206-14. These circuits may take the form of those circuits disclosed in U.S. Pat. No. 4,072,853 which issued Feb. 7, 1978. Additionally, the section 206 enables a return of identification information received from the data lines BSDT00-15 and stored in register 209-4 via the address lines BSAD08-23.

Additionally, the circuits of block 206-20, in response to the syndrome bit signals from EDAC circuits 206-12 and 206-14, generate signals indicating whether the information being transferred to the bus is in error and whether or not the error is correctable. That is, when signal MYYEL0110 is forced to a binary ONE, this indicates that the accompanying transferred information is correct but that a correction operation was performed (i.e., a hard or soft error condition). However, when signal MYREDD010 or MYREDR010 is forced to a binary ONE, this indicates that the accompanying transferred information is in error (i.e., an uncorrectable error condition). These signals, in turn, are used to generate the signals applied to bus lines BSREDD, BSREDR and BSYELO. For further details concerning the generation of these signals, reference may be made to U.S. Pat. No. 4,072,853.

The soft error rewrite control section 214 includes circuits for periodically accessing each of the locations within the memory section 210 for reading out and rewriting back into these locations corrected information so as to render the memory 210 less susceptible to soft errors produced by alpha particles or other system disturbances. As seen from FIG. 1, section 214 receives control signals from sections 205, 212, 213, and 216. The section provides control signals to sections 204, 206, and 207, as shown.

In accordance with the teachings of the present invention, diagnostic mode control section 216 includes circuitry for conditioning sections 206 and 214 to enable rapid testing and verification of the operation of the soft error rewrite control apparatus of section 214. As seen from FIG. 1, section 216 receives control signals from sections 204, 208, 211, and 213.

Pertinent portions of the above sections will be now discussed in greater detail with reference to FIGS. 2 through 7.

DETAILED DESCRIPTION OF CONTROLLER SECTIONS

Only those sections which are believed necessary to an understanding of the present invention are described herein. For further information regarding the remaining sections, reference may be made to the related patent applications or to U.S. Pat. No. 4,185,323.

Section 204 and Section 206

FIG. 3 illustrates in greater detail, the timing circuits of section 204. The circuits receive input timing pulse signals TTAP01010 and TTAP02010 from delay line timing generator circuits, not shown, conventional in design. Such circuits may take the form of the timing generator circuits shown in U.S. Pat. No. 4,185,323. The timing generator circuits generate a series of timing pulses via a pair of series connected 200 nanosecond delay lines in response to the signal MYACKR10 being switched to a binary ONE. These pulses in conjunction with the circuits of block 204 establish the timing for the remaining sections during a memory cycle of operation.

Additionally, the circuits of block 204 receive a boundary signal MYBNDY010, address signals LSAD22200 and LSAD22210 from section 207 and soft error rewrite control signal ALPCNT010 from section 214. Also, section 212 applies an initialize signal INITMM100 to section 204. The signals MYBNDY010 and ALPCNT010 are applied to a NOR gate 204-5 each of which force signal RASINH010 to a binary ZERO when forced to a binary ONE. The series connected AND gate 204-7 logically combines initialize signal INITMM100, refresh command signal REFCOM100 generated by circuits within section 204, not shown, to produce signal RASINH000. A NAND gate 204-8 combines signals RASINH000 and address signal LSAD22210 to produce an even row strobe inhibit signal ERASIH000. The signal is applied to an AND gate 204-10 for combining with a timing signal MRASTT010 derived from signal TTAP01010 via an AND gate 204-1. The result output signal MRASTE010 is applied to the RAS timing input of the even stack units 210-20.

A NAND gate 204-14 combines signals RASINH010 and LSAD22200 to produce an odd row inhibit signal ORASIH000. This signal is combined in an AND gate 204-17 with timing signal MRASTT010 to generate row timing signal MRAST0010. This signal is applied to the RAS timing input of the odd stack units 210-40.

As seen from FIG. 3, an AND gate 204-11 applies a timing signal MDECT0010 to a G input terminal of the middle section of even data register 206-8 in the absence of a refresh command (i.e., signal REFCOM000=1). Similarly, an AND gate 204-15 applies a timing signal MDOCT0010 to a G input terminal of the middle section of odd data register 206-10. The delay network 204-19 which connects in series with AND gates 204-3, 204-18 and 204-20 generate timing signal MCASTS010. The signal MCASTS010 is applied to the CAS timing input of the even and odd stack units 210-20 and 210-40.

The even and odd data registers 206-8 and 206-10 are tristate operated. More specifically, the registers are constructed from D type transparent latch circuits such as those designated SN74S373 manufactured by Texas Instruments Incorporated. The register circuits are transparent meaning that while the signal applied to the G input terminal is a binary ONE, the signals at the Q output terminals follow the signals applied to the D input terminals. That is, when the signal applied to the G input terminal goes low, the signal at Q output terminal latches.

The output terminals of registers 206-8 and 206-10 are connected in common in a wired OR arrangement for enabling the multiplexing of the pair of data word signals. Such multiplexing is accomplished by controlling the states of the signals MDOTSC000, MDOTSC010 and MDRELB000 applied to the output control (OC) input terminals of the different sections of registers 206-8 and 206-10 shown in FIG. 1. This operation is independent of the latching action of the register flip-flops which takes place in response to the signals applied to the G input terminals.

The series connected group of gates 204-22 through 204-28 control the states of signals MDOTSC100 and MDOTSC010. The AND gate 204-22 receives timing signals DLYINN010 and DLY020100 at the beginning of a read or write cycle for enabling the storage of identification information from the bus. Since this is not pertinent to an understanding of the present invention, signal PULS20210 can be considered to be at a binary ZERO state. During a read operation, read command signal READCM000 is forced to a binary ZERO which causes AND gate 204-26 to force signal MDOTSC100 to a binary ZERO and NAND gate 204-28 to force signal MDOTSC010 to a binary ONE.

The signal MDOTSC100, when a binary ZERO, enables the middle sections of registers 206-8 and 206-10 to apply their contents to their output terminals. The signal MDOTSC010 when a binary ONE, inhibits the right most sections of registers 206-8 and 206-10 from applying their contents to their output terminals. During a write cycle, when read command signal READCM000 is forced to a binary ONE, AND gate 204-26 forces signal MDOTSC100 to a binary ONE while NAND gate 204-28 forces signal MDOTSC010 to a binary ZERO when signal ALPCNT000 is a binary ONE. This produces the opposite result to that described. That is, signal MDOTSC100 inhibits the middle sections of registers 206-8 and 206-10 from applying their contents to their output terminals. If signal ALPCNT000 is a binary ZERO, this inhibits NAND gate 204-28 from forcing signal MDOTSC010 to a binary ZERO in response to signal READCM000. Accordingly, the right most sections of registers 206-8 and 206-10 are also inhibited from applying their contents to their output terminals.

Lastly, the section 204 further includes an AND gate 204-30. This AND gate in response to the timing signals DLY400010 and DLY220010 generated by the delay line timing circuits provides a reset signal RESET010 which is used to reset the soft error rewrite control circuits of section 214.

Section 207

FIG. 2 illustrates the different sections of address section 207. As shown, section 207 includes an input address section 207-1, an address decode section 207-2, an address register section 207-4 and a refresh and initialize address register input section 207-6.

Sections 207-1 and 207-2

The input address section 207-1 includes a set of manually selectable switches of block 207-10 which receive bus address signals BSAD04110 and BSAD06110. These switches select the high order bus address bit which selects the upper/lower 256K of memory when the system includes the full complement of 128K memory modules. When the memory modules are constructed using 64K chips, the top switch is placed in the closed position. This selects address bit 4 (signal BSAD04110) as the high order bus address bit. For 16K chips, the other switch is placed in the closed position which selects address bit 6.

Since it is assumed that the memory modules use 64K chips, the top switch is closed while the other switch is opened. The resulting high order bit signal BSADX6010 in addition to its complement along with the least significant bus address bits 22 and 21 are stored in a register 207-12. The three signals are loaded into a register 207-12 when address strobe signal ADDSTR000 is forced to a binary ZERO. This occurs when the memory becomes busy (i.e., accepts a bus cycle/a memory request).

The outputs of register 207-12 are applied as inputs to a 2 to 1 MUX (SN74S157), conventional in design. As shown, signal APLCNT000 from section 214 is inverted via inverter circuit 207-16 and applied as signal ALPCNT010 to the select input terminal (G0/G1) of circuit 207-14. When signal ALPCNT010 is a binary ZERO, signals BSAD22210 through BSADX6210 of register 207-12 are selected to be applied at the Y output terminals of circuit 207-14. When signal ALPCNT010 is a binary ONE, signals ARAD21010 and ARADX6010 from section 207-6 are selected to be applied to the Y2 and Y3 output terminals while Y1 output terminal is forced to a binary ZERO.

As shown, the least significant address bit signals LSAD22210 and LSAD21210 are applied to the input terminals of a binary decoder circuit 207-20. The least significant bit address signal LSAD22210 and its complement signal LSAD22200 generated by an inverter circuit 207-22 are applied to sections 204 and 206. The high order bit signal LSADX6210 is applied to the enable/gate input terminal of decoder circuit 207-20. The complement signal LSADX6200 generated by an inverter circuit 207-15 is applied to the enable/gate input of decoder circuit 207-31, together with address signals LSAD22210 and LSAD21210. When high order address signal LSADX6210 is a binary ZERO, decoder circuit 207-20 is enabled for operation. Similarly, when signal LSADX6210 is a binary ONE, decoder circuit 207-31 is enabled for operation.

Each of the four decode outputs DECOD0000 through DECOD3000 connects to a different pair of the NAND gates 207-24 through 207-30. It will be noted that the zero decode signal DECOD0000 connects to the inputs of NAND gates 207-24 and 207-26 which generate the 0 and 1 row address strobe signals. Similarly, the 1 decode signal DECOD1000 connects to the inputs of NAND gates 207-26 and 207-28 which generate the 1 and 2 row address strobe signals. The next sequential decode signal DECOD2000 connects to the two NAND gates which generate the next pair of sequential row address strobe signals. Lastly, the last decode signal DECOD3000 connects to NAND gates 207-30 and 207-24 which generate the 3 and 0 row address strobe signals. In a similar fashion, each of the four decode outputs DECOD4000 through DECOD7000 connects to a different pair of the NAND gates 207-32 through 207-38.

As seen from FIG. 2, all of the NAND gates 207-24 through 207-30 and 207-32 through 207-38 receive a further input signal OVRDEC000 generated by an AND gate 207-39. When either initialize signal INITMM100 or refresh command signal REFCOM100 is forced to a binary ZERO by the circuits of section 212 or section 204, AND gate 207-39 forces signal OVRDEC000 to a binary ZERO. This turns on all the decode signals (i.e., signals DRAST0010 through DRAST7010 are forced to binary ONES) enabling eight memory locations to be written simultaneously during an initialize mode of operation, or "refreshed" during a refresh mode.

As shown, the even row address strobe signals DRAST0010 and DRAST2010 are applied to the RAM chips of the even stack units 210-20. The odd row address strobe signals DRAST1010 and DRAST3010 are applied to the RAM chips of the odd stack units 210-40.

Section 207-4

The address register section 207-4 as shown in FIG. 2 receives the bus address signals BSAD05210 through BSAD20210 applied via the bus receiver circuits of block 213 of FIG. 1 as inputs to different stages of a row address register 207-40 and a column address register 207-41. Also, as seen from FIG. 2, this section receives inputs from the circuits of block 207-6 which are applied to different stages of a refresh address register 207-42 and a column address register 207-43. The enabling gate input terminals of registers 207-40 and 207-41 are connected to receive a memory busy signal MEMBUZ010 from section 204. The enabling gate input terminals of registers 207-42 and 207-43 are connected to a +5 volts source. The OC input terminal of row address register 207-40 is connected to receive a timing signal MRASCT000 generated by AND gate 207-44, inverter circuit 207-46 and NAND gate 207-47 in response to signals INITMM000, REFCOM000 and MCASTT010. The OC input terminal of column address register 207-41 is connected to receive a timing signal MCASCT000 generated by NAND gate 207-48 and NAND gate 207-50 in response to signals INTREF000 and MCASTT010. The signal INTREF000 is generated by series connected AND gates 207-44 and 207-48 which receive signals INITMM000, REFCOM000 and ALPCNT000. The OC input terminal of refresh address register 207-42 is connected to receive a control signal MREFCT000 generated by NAND gate 207-49, NAND gate 207-51 and inverter circuit 207-45, in response to signals INTREF000, MCASTT010, and INITAL110.

Each of the address registers 207-40 through 207-43 are constructed from D type transparent latch circuits such as those designated as SN74S373 previously discussed. As seen from FIG. 2, the different address output terminals of the registers of each set are connected in common in a wired OR arrangement for enabling the multiplexing of these address signals. As previously described, such multiplexing is accomplished by controlling the state of the signals applied to the output control (OC) input terminals of the registers 207-40 through 207-43.

More specifically, the output control (OC) terminals enable so-called tristate operation which is controlled by the circuits 207-44 through 207-51. When each of the signals MRASCT000, MCASCT000 and MWRTCT000 is in a binary ONE state, this inhibits any address signals from being applied at the Q output terminals of that register. As mentioned, this operation is independent of the latching action of the register flip-flops.

Additionally, section 207-4 includes a 4-bit binary full adder circuit 207-54, conventional in design. The adder circuit 207-54 is connected to increment by one, the low order address bits 20 through 17. In greater detail, the input terminals A1-A8 receive signals MADD00010 through MADD03010. Binary ZERO signals are applied to input terminals B1-B8. An AND gate 207-56 generates a carry in signal MADDUC010 as a function of the states of the least significant address signals LSAD22210 and LSAD21210, signal INTREF000 and timing signal DLY060010.

Figure 7:
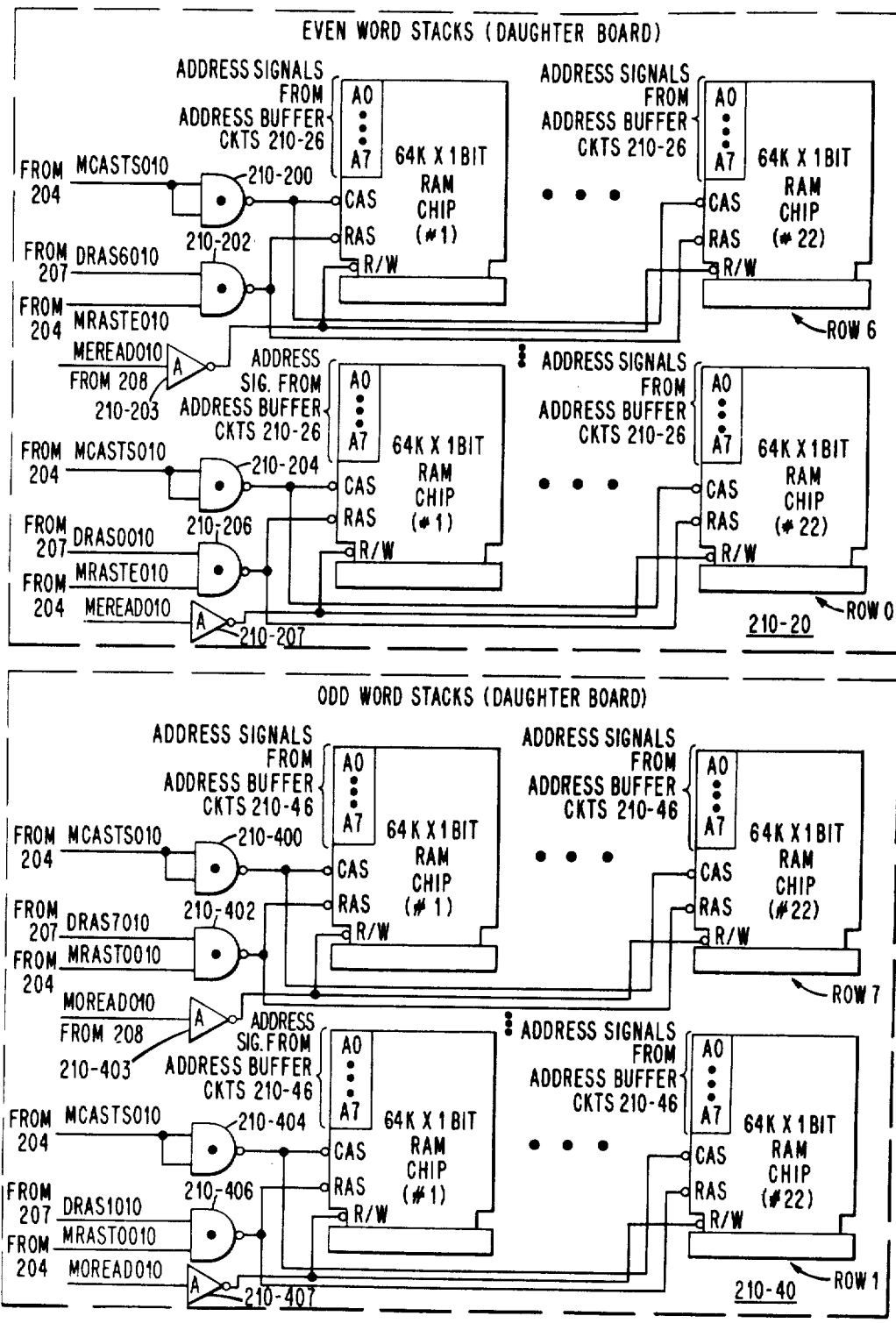
FIG. 7 discloses in greater detail the chips of blocks 210-20 and 210-40.

The incremented output signal MADD00111 through MADD03111 appearing at adder sum terminals S1-S8 are applied via address buffer circuits 210-26 to the even stack RAM chips of FIG. 7. The same is true of signals MADD0410 through MADD07010. The odd stack RAM chips of FIG. 7 are connected to receive the address signals MADD0010 through MADD07010 via address buffer circuits 210-46.

Section 207-6

The refresh and initialize address register input section 207-6 includes the refresh counter and write address counter circuits which generate the address values applied to the refresh and write address registers of section 207-4. As shown, the refresh counter circuits include two series connected binary counters 207-60 and 207-61, each constructed from 74LS393 type circuit chips. Counter 207-60 is connected to receive a clocking signal RADDUC000 which is generated by an inverter circuit 207-67, NOR gate 207-66 and AND gates 207-65 and 207-68 in response to signals ALPHUC010, REFCOM000 and MCASTT010. Both counters receive a clearing signal MYCLRR010 from section 212.

The write counter circuits also include two series connected binary counters 207-62 and 207-63 which are driven by signal REFAD8010 from the refresh counter circuits. Both counters receive a clearing signal MYCLRR110 generated by a NAND gate 207-69 in response to signals MYCLRR000 and PWONLL010.

The circuits further include a D type flip-flop 207-71 which serves as an extra stage of counter 207-63. The flip-flop 207-71 is connected to receive the complement signal WRITA7100 of most significant write address bit signal WRITA7010 from an inverter circuit 207-72. Initially, when signal WRITA7010 is a binary ZERO, signal WRITA7100 is a binary ONE. Upon power-up, the D type flip-flop 207-71 is cleared by signal MYCLRR100. When signal WRITA7010 switches to a binary ONE at the end of a first pass, signal WRITA7100 switches from a binary ONE to a binary ZERO which has no effect on the state of flip-flop 207-71. Upon completion of a second pass, signal WRITA7010 switches back to a binary ZERO which causes signal WRITA7100 to switch flip-flop 207-71 from a binary ZERO to a binary ONE. At this time, signal MADROL000 switches from a binary ONE to a binary ZERO. The signal MADROL000 is applied to section 212 and is used to signal the completion of the initialization operation. The flip-flop 207-71 is enabled for operation by signal PWONLL010 and a +5 volt signal which are applied to the preset and D input terminals, respectively. Also, a NAND gate 207-70 applies a signal MYCLRR100 to the clear input terminal which is generated in response to signal PWONLL300 and PWONLL010 from section 212.

As seen from FIG. 2, section 207-6 includes a further binary counter 207-64. This counter also receives signal WRITA7010 from write address counter 207-63. It receives clearing signal MYCLRR110 from NAND gate 207-69. As explained herein, this counter supplements the existing and refresh and initialization circuits and forms a part of the soft error rewrite control circuits 214.

Read/Write Control Section 208

Figure 5:
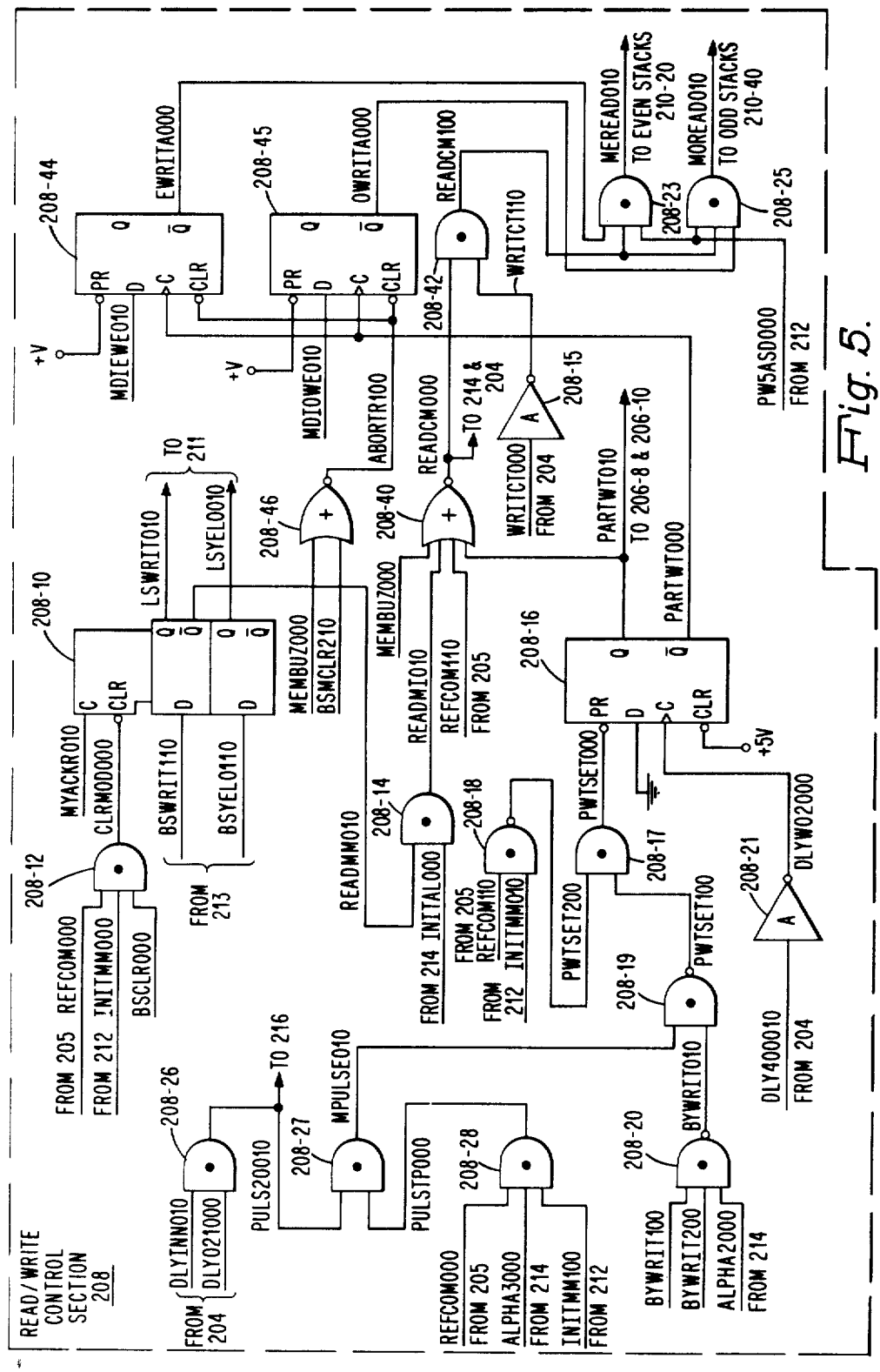
FIG. 5 discloses in greater detail the read/write control circuits of block 208.

A portion of the circuits of section 208 is shown in greater detail in FIG. 5. As mentioned, the section 208 includes a register 208-10 and circuits 208-12 through 208-45. The register 208-10 is a two-stage D-type flip-flop register for storing signal BSWRIT110 which is representative of a read/write command and signal BSYELO110 which is representative of a bus single bit error condition. These signals are latched when signal MYACKR010 from section 211 switches to a binary ONE. When any one of the signals REFCOM000, INITMM000, or BSMCLR000 switches to a binary ZERO, and AND gate 208-12 forces signal CLRMOD000 to a binary ONE which clears register 208-10 to a binary ZERO state.

The write mode signal LSWRIT010 and error condition signal LSYEL0010 are applied to section 211. The read mode signal READMM010 is applied to an AND gate 208-14 which also receives an initialize signal INITAL000 from section 214.

The AND gate 208-14 in response to a read command (i.e., signal READMM010 is a binary ONE) when the system is not being initialized or is carrying out a soft error rewrite cycle operation (i.e., signal INITAL000 is a binary ONE) forces signal READMI010 to a binary ONE. When signal READMI010 is a binary ONE, this causes a NOR gate 208-40 to force a read command signal READCM000 to a binary ZERO. An AND gate 208-42 in response to signal READCM000 forces signal READCM100 to a binary ZERO. A pair of AND gates 208-23 and 208-25 force signals MEREAD010 and MOREAD010 to binary ZEROS. These signals are applied to the read/write control lines of the even and odd stack units 210-20 and 210-40. However, the signals are inverted by circuits included with units 210-20 and 210-40 as shown in FIG. 7 before being applied to the chips which comprise such units.

Another one of the input signals to NOR gate 208-40 is partial write signal PARTWT010. As discussed in U.S. Pat. No. 4,185,323, there are certain types of memory operations such as byte write and initialize operations which require two cycles of operation. The same is true for soft error rewrite cycles of operation. As mentioned, in the case of an initialize or a soft error rewrite operation, signal INITAL000 is forced to a binary ZERO. This is effective to override the command applied to the bus. The read/write command signals MEREAD010 and MOREAD010 applied to the stack units 210-20 and 210-40 are generated as a function of signal PARTWT010. Signal PARTWT010 when forced to a binary ONE remains a binary ONE until the end of the first cycle and initiates a second cycle of operation during which another set of timing signals identical to the first are generated by the circuits of section 204. During the first cycle, the read/write command signals are forced to binary ZEROS and during the second cycle, the signals are forced to binary ONES. The signal PARTWT010 is generated by a D-type flip-flop 208-16 with associated input circuits 208-17 through 208-26. The flip-flop 208-16 is enabled for switching when signal PWTSET000 applied to preset input terminal is forced to a binary ZERO by AND gates 208-17, 208-26 and 208-28, in addition to NAND gates 208-18, 208-19 and 208-20 in response to refresh command signal REFCOM110, initialize signal INITMM010, timing signal MPULSE010, byte write signals BYWRIT100 and BYWRIT200 and phase 2 signal ALPHA2000. This enables flip-flop 208-16 to switch to a binary ONE. The flip-flop 208-16 switches to a binary ZERO state in response to signal DLYW02000 being applied to the clock input terminal via an inverter circuit 208-21. The +5 volts signal applied to the clear input terminal of flip-flop 206-18 inhibits resetting. In the same manner as described above, partial write signal PARTWT010 when forced to a binary ONE initiates a read cycle of operation prior to initiating the write cycle of operation required for the execution of the above mentioned operations in addition to each soft error rewrite control operation of the present invention as explained herein. As seen from FIG. 1, partial write signal PARTWT010 is applied to the G input terminals of the right most sections of registers 206-8 and 206-10. Signal PARTWT010 when a binary ONE enables the storage of the output signals from EDAC circuits 206-12 and 206-14.

The other signals MEMBUZ000 and REFCOM110 applied to NOR gate 208-40 are forced to binary ONES prior to the start of a memory cycle of operation and during a refresh cycle respectively. It will be noted from FIG. 5 that during a write cycle of operation when signal WRITCT000 is forced to a binary ZERO by the circuits of section 204, signal WRITCT110 generated by an inverter circuit 208-15 causes AND gate 208-42 to switch signal READCM100 to a binary ONE. This, in turn, causes AND gates 208-23 and 208-24 to force signals MEREAD010 and MOREAD010 to binary ONES indicating that the stack units 210-20 and 210-40 are to perform a write cycle of operation. At this time, a power on signal PW5ASD000 from section 212 is normally a binary ONE while abort write signals EWRITA000 and OWRITA000 in the absence of error conditions are binary ONES.

As seen from FIG. 5, the signals EWRITA000 and OWRITA000 are received from flip-flops 208-44 and 208-45. These flip-flops receive as inputs signals MDIE-WE010 and MDIOWE010 from EDAC circuits 206-12 and 206-14. The states of these signals are stored in the flip-flops 208-44 and 208-45 when signal PARTWT010 switches from a binary ONE to a binary ZERO. The flip-flops 208-44 and 208-45 are cleared to ZEROS via a NOR gate 208-46 when the memory is not busy (i.e., signal MEMBUZ000 is a binary ONE) or is cleared (i.e., signal BSMCLR210 is a binary ONE).

Memory Units 210-20 and 210-40—FIG. 7

As previously discussed, the even word and odd word stacks of blocks 210-20 and 210-40 are shown in greater detail in FIG. 7. These stacks include four rows of 22, 64K×1-bit RAM chips as shown. Each 64K chip includes two 32,768 bit storage arrays. Each array is organized into a 128 row by 256 column matrix and connects to a set of 256 sense amplifiers. It will be appreciated that other 64K chip organizations may also be utilized. The chips and associated gating circuits are mounted on a daughter board. Each daughter board includes 2 inverters (e.g. 210-203, 210-207) which are connected to receive a corresponding one of the read/- write command signals from section 208 and four, 2 input NAND gates (e.g. 210-200 through 210-206 and 210-400 through 210-406) which are connected to receive the row and column timing signals from section 204 and the row decode signals from section 207. Only those chip terminals pertinent to an understanding of the present invention are shown. The remaining terminals, not shown, are connected in a conventional manner. For further information, reference may be made to the copending patent application "Rotating Chip Selection Technique and Apparatus", invented by Chester M. Nibby, Jr. and William Panepinto, Jr., Ser. No. 921,292, filed on July 3, 1978 and assigned to the same assignee as named herein.

SOFT ERROR REWRITE CONTROL SECTION 214

Figure 4:
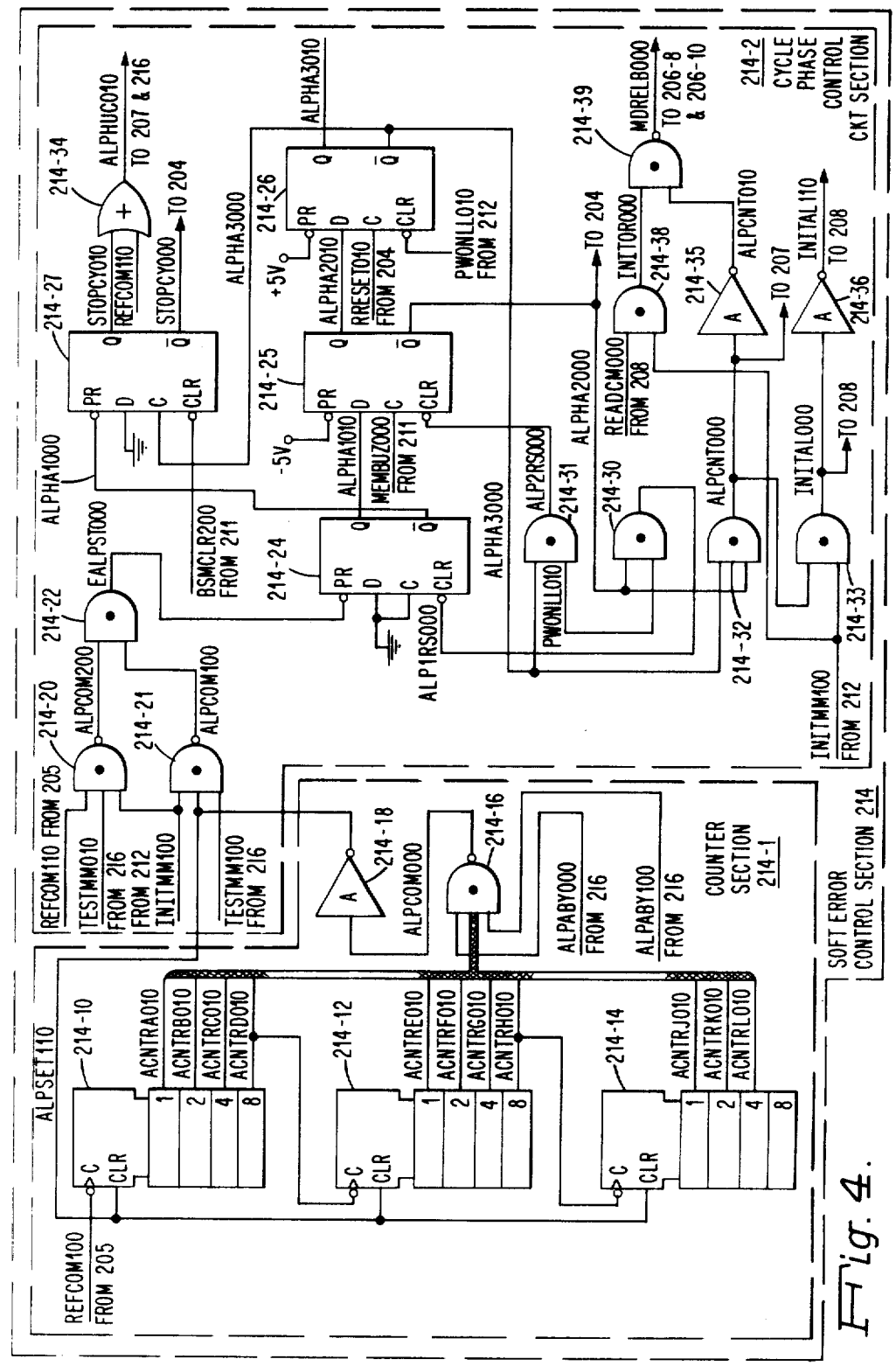
FIG. 4 discloses in greater detail the circuits of block 214.

FIG. 4 shows in greater detail, the soft error rewrite control circuits. The section 214 includes a counter section 214-1 and a cycle phase control circuit section 214-2. The section 214-1 establishes the cycle timing for performing a soft error rewrite cycle operation enabling every location in memory to be addressed. Section 214-2 generates the required control signals which define the different phases of operation.

In greater detail, section 214-1 includes three series connected binary counters 214-10 through 214-14, a NAND gate 214-16 and an inverter circuit 214-18. The counters 214-10 through 214-14 constructed from type 74LS393 chips are incremented by one at the end of each refresh cycle in response to signal REFCOM100. This synchronizes the counter operations with the refresh counter circuits. The 11 outputs from the counter stages are applied to NAND gate 214-16. This gate monitors the counts generated by the counters and forces a command signal ALPCOM000 to a binary ZERO each time the counters reach a predetermined count. This predetermined count is selected to have a value which clears out soft errors from memory at a rate which provides a minimum of interference with normal memory operations. The rate is such that after every 2,047 refresh cycles or counts, a rewrite cycle is performed. Therefore, the 512 thousand memory locations can be cleared from the effects of alpha particle contamination or other noise signal disturbances within a two-hour period.

Additionally, NAND gate 214-16 also receives signals ALPABY000 and ALPABY100 from section 216. When either signal ALPABY000 or signal ALPABY100 is forced to a binary ONE, this inhibits NAND gate 214-16 from forcing signal ALPCOM000 to a binary ZERO. As explained herein, this bypasses or renders the circuits of section 214 inoperative.

As seen from FIG. 4, the inverter circuit 214-18 inverts the command signal ALPCOM000 to generate a set signal ALPSET110. This signal is applied to the clear input terminals of binary counters 214-10 through 214-14 and to an input NAND gate 214-21 of section 214-2. When signal ALPSET110 is forced to a binary ONE, it clears counters 214-10 through 214-14 to ZEROS for starting a new count.

As seen from FIG. 4, section 214-2 includes a pair of input NAND gates 214-20 and 214-21 which connect to an AND gate 214-22, three phase control D-type flip-flops 214-24 through 214-26 which connect in series, a stop cycle D-type flip-flop 214-27 and associated input and output gate and inverter circuits 214-30 through 214-36 connected, as shown. Each of the flip-flops 214-24 through 214-26 are cleared to binary ZEROS in response to a power on signal PWONLL010 generated by the circuits of section 212 (i.e., when signal PWONLL010 is a binary ZERO). The stop cycle flip-flop 214-27 is reset to a binary ZERO state when a bus clear signal BSMCLR200 is forced to a binary ZERO.

The NAND gate 214-20 receives as one input, refresh command signal REFCOM110 from section 205 and as a second input, a test mode signal TESTMM010 from section 216. As explained herein, the NAND gate 214-20 generates signal ALPCOM200 which enables the circuits of this section to operate in a high speed mode of operation. The NAND gate 214-21 receives as one input, signal ALPSET110 from inverter circuit 214-18 and as a second input, a complement test mode signal TESTMM100 from section 216. As explained herein, NAND gate 214-21 generates signal ALPCOM100 during the normal operation of the circuits of section 214. Both NAND gates 214-20 and 214-21 receive as a third input, initialize signal INITMM100 from section 212.

During normal operation (i.e., TESTMM100 is a binary ONE), when an initialize operation is not being performed, (i.e., signal INITMM100 is a binary ONE), NAND gate 214-21 in response to signal ALPSET110 being forced to a binary ONE, forces a command signal ALPCOM100 to a binary ZERO. This causes AND gate 214-22 to force signal EALPST000 to a binary ZERO switching the phase 1 flip-flop 214-24 to a binary ONE. In a similar manner, during a high speed mode of operation (i.e., signal TESTMM010 is a binary ONE) when an initialize operation is not being performed, NAND gate 214-20, in response to refresh command signal REFCOM110 being forced to a binary ONE, forces command signal ALPCOM200 to a binary ZERO. The flip-flop 214-24 when in a binary ONE state defines the refresh portion of the rewrite cycle. The binary ZERO output signal ALPHA1000 is applied to the preset terminal of stop cycle flip-flop 214-27. This switches flip-flop 214-27 to a binary ONE state.

The memory busy signal MEMBUZ000 is switched to a binary ZERO in response to a refresh command (i.e., when signal REFCOM110 switches to a binary ONE). At the end of the refresh cycle when the memory busy signal switches from a binary ZERO to a binary ONE, signal ALPHA1010 causes the phase 2 flip-flop 214-25 to switch to a binary ZERO which, in turn, resets the phase 1 flip-flop 214-24 to a binary ZERO state via AND gate 214-30. The flip-flop 214-25 when in a binary ONE state defines the read portion of the rewrite cycle sequence.

The binary ONE output signal ALPHA2010 is applied to the D input terminal of the phase 3 flip-flop 214-26. When the RRESET010 pulse signal is generated by the circuits of section 204 at the end of the read cycle of operation, the trailing edge of the pulse signal switches flip-flop 214-26 to a binary ONE state. The binary ZERO output signal ALPHA3000 upon being switched to a binary ZERO resets phase 2 flip-flop 214-25 to a binary ZERO via AND gate 214-31. The binary ONE state of the phase 3 flip-flop 214-26 defines the write portion of the rewrite cycle. At the end of the write cycle of operation, RRESET010 pulse signal switches the phase 3 flip-flop 214-26 to a binary ZERO state since the signal ALPHA2010 is a binary ZERO at this time.

When either the phase 2 flip-flop 214-25 or phase 3 flip-flop 214-26 is a binary ONE, the signal ALPHA2000 or signal ALPHA3000 applied to AND gate 214-32 forces signal ALPCNT000 to a binary ZERO. The signal ALPCNT000 when forced to a binary ZERO conditions the circuits of section 207 to select the address signals from the rewrite counter circuit for decoding during these portions of the cycle sequence. Additionally, signal ALPCNT000 causes AND gate 214-33 to force signal INITAL000 to a binary ZERO which conditions the circuits of section 208 so as to override bus commands during the read and write portions of a rewrite cycle.

Additionally, signals INITMM100 and READCM000 when binary ONES cause an AND gate 210-38 to force signal INITOR000 to a binary ONE. This signal together with the complement signal ALPCNT010 generated by an inverter circuit 214-35 when forced to binary ONES, condition a NAND gate 214-39 to force signal MDRELB000 to a binary ZERO. As seen from FIG. 1, signal MDRELB000 is applied to the OC terminals of the right sections of registers 206-8 and 206-10. When a binary ZERO, signal MDRELB000 enables the contents of these registers to be applied to their output terminals.

It will also be noted that when the phase 3 flip-flop 214-26 is reset to a binary ZERO, the switching of signal ALPHA3000 from a binary ZERO to a binary ONE resets the stop cycle flip-flop 214-27 to a binary ZERO. This causes a change in state of up count signal ALPHUC010 generated by OR gate 214-34 which, in turn, increments by one the counter circuits of section 207. OR gate 214-34 also generates an increment signal at the end of a refresh cycle in response to signal REFCOM110.

DIAGNOSTIC MODE CONTROL SECTION 216

Figure 6:
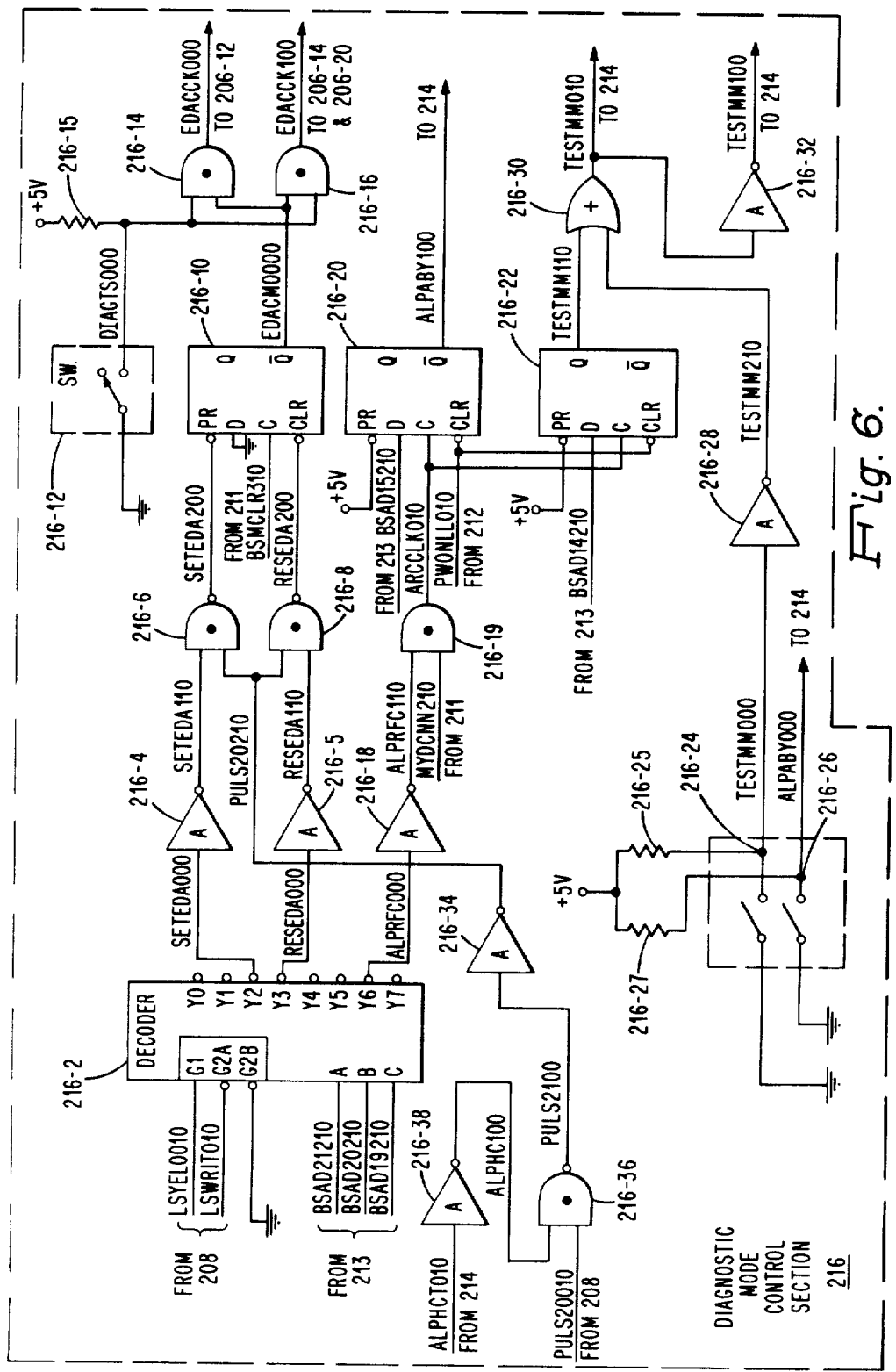
FIG. 6 discloses in greater detail the circuits of block 216 of the present invention.

FIG. 6 shows in greater detail, the diagnostic mode control circuits of the preferred embodiment of the present invention. These circuits generate signals which establish the required modes of operation for the system as FIG. 1 which facilitate testing and verification of the soft error rewrite control section.

As shown, the circuits include a 3 to 8 binary decoder circuit 216-2, an EDAC mode flip-flop 216-10 and manual diagnostic switch 216-12, a soft error rewrite control bypass mode flip-flop 216-20, and a test mode flip-flop 216-22 and manual switches 216-24 and 216-26.

The decoder circuit 216-2 is enabled for operation when signal LSYEL0010 is forced to a binary ONE and signal LSWRIT010 is forced to a binary ZERO. The circuit 216-2 in response to particular codings of the binary coded signals BSAD21210, BSAD20210, and BASD19210 applied to its terminals A, B and C forces a corresponding one of its output terminals to a binary ZERO. For example, when bits 19,20 and 21 have the value "010", signal SETEDA000 is forced to a binary ZERO. Similarly, the values "011" and "110" respectively force signals RESEDA000 and ALPRFC000 to binary ZEROS.

As shown, signal SETEDA000 is applied to the preset (PR) input terminal of the D-type flip-flop 216-10 via a series connected inverter circuit 216-4 and NAND gate 216-6. Similarly, signal RESEDA000 is applied to the clear (CLR) input terminal of flip-flop 216-10 via another series connected inverter circuit 216-5 and NAND gate 216-8.

Both NAND gates 216-6 and 216-8 receive timing signal PULS20210. This signal is generated by series connected inverter circuit 216-38, NAND gate 216-36 and inverter circuit 216-34 in response to signal ALPHCT010 from section 214 and timing signal PULS20010 from section 208. The flip-flop 216-10 also receives signal BSMCLR310 from section 211 which is applied to its clock (C) input terminal, as shown. The binary ZERO output terminal of flip-flop 216-10 is applied to one of the input terminals of each of a pair of AND gates 216-14 and 216-16. The other input terminal of each AND gate receives signal DIAGTS000 from the output terminal of the push button switch 216-12.

When either the switch 216-12 is pressed or the flip-flop 216-10 is set to a binary ONE, AND gates 216-14 and 216-16 force signals EDACCK000 and EDACCK100 to binary ZERO. As explained herein, the signals EDACCK000 and EDACCK100 are applied to EDAC circuits 206-12 and 206-14, respectively, and when binary ZEROS cause the sets of check bit signals MDIEC0-C5 and MDIOC0-C5 to be forced to binary ZEROS.

The signal ALPREFC000 from decoder circuit 216-2 is applied to the clock (C) input terminal of D-type flip-flop 216-20 via series connected inverter circuit 216-18 and AND gate 216-19. The flip-flop preset input terminal is connected to receive a binary ONE +5 volts signal while its clear (CLR) input terminal is connected to receive a power on signal PWONLL010 from section 212. The data (D) input terminal receives address bit 15 signal BSAD15210 from a receiver circuit of section 213. The output of flip-flop 216-20 which corresponds to signal ALPABY100 is applied to section 214.

As seen from FIG. 6, the signal ARCCLK010 produced by AND gate 216-19 is also applied to the clock (C) input terminal of D-type flip-flop 216-22. The flip-flop's other input terminals receive the same signals as applied to flip-flop 216-20 except for the D input terminal receiving address bit 15 which is replaced with signal BSAD14210 from a receiver circuit section 213.

Both flip-flops 216-20 and 216-22 are conditioned during the positive going transition of clocking signal ARCCLK010 to switch state as a function of the states of address bits 15 and 14. Switching occurs when signal MYDCNN210 is forced to a binary ONE by the circuits of section 211.

The binary ONE output of flip-flop 216-22 is applied to one input terminal of an OR gate 216-30. The other input terminal of OR gate 216-30 is connected to the output of test mode switch 216-24 through an inverter circuit 216-28.

When either flip-flop 216-22 is set to a binary ONE or switch 216-24 is placed in the "on" (i.e., closed) position, OR gate 216-30 forces signal TESTMM010 to a binary ONE. The signal TESTMM010 and its complement signal TESTMM100 produced by an inverter circuit 216-32 are applied to section 214.

In a similar fashion, switch 216-26 when placed in the "on" (i.e., closed) position forces signal ALPABY000 to a binary ZERO. It will be noted that the output terminal of switch 216-26 connects to a +5 volt source through a termination resistor 216-27. Accordingly, switch 216-26 when placed in the "off" (i.e., open) position forces signal ALPABY000 to a binary ONE. Similarly, the output terminals of switches 216-24 and 216-12 connect to +5 volt sources through termination resistors 216-25 and 216-15, respectively. Therefore, when either switch 216-24 and 216-12 is placed in the "off"

position, this results in signal TESTMM000 or signal DIAGTS000 being forced to a binary ONE.

DESCRIPTION OF OPERATION

With reference to FIGS. 1–7, the operation of the preferred embodiment of the present invention will now be described with particular reference to the timing diagram of FIGS. 8a and 8b.

Figure 9A:
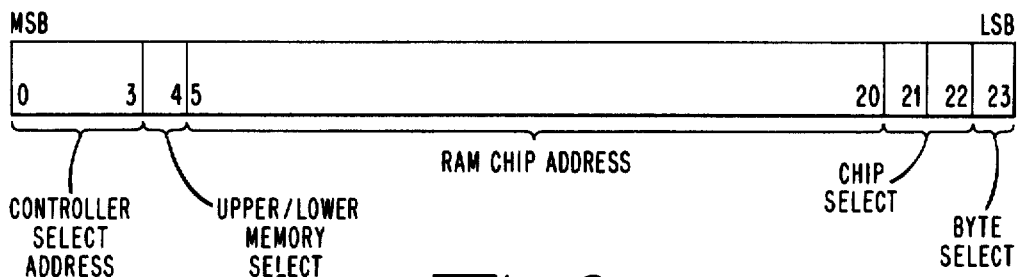
FIGS. 9a and 9b illustrate the format of the memory addresses/commands applied to controller 200 as part of each memory read or write request.

Before discussing an example of operation, reference is first made to FIG. 9a. FIG. 9a illustrates the format of the memory addresses applied to the controller as part of each memory read or write request. The high order/most significant bit positions are coded to identify the memory module/controller to process the request. Address bit 4 is used to select which 256K half (i.e., upper or lower half) of controller memory is being accessed. These address bits are processed by the circuits of controller 200 and are not provided to the RAM chips.

Address bits 5–20 specify the address of the 22-bit storage location within the RAM chips being addressed. As explained in greater detail herein, these 16 address bits are multiplexed into 8 address inputs and applied via the address buffer circuits of blocks 210-26 and 210-46 to the address input terminals A0-A7 of the RAM chips of FIG. 7.

The least significant address bits 21–22 are coded to select which row of RAM chips are being addressed. As discussed herein, these bits are decoded and used to generate a pair of row address strobe (RAS) signals which latch the 8-bit row addresses into the desired row of RAM chips within each memory stack.

Figure 9B:
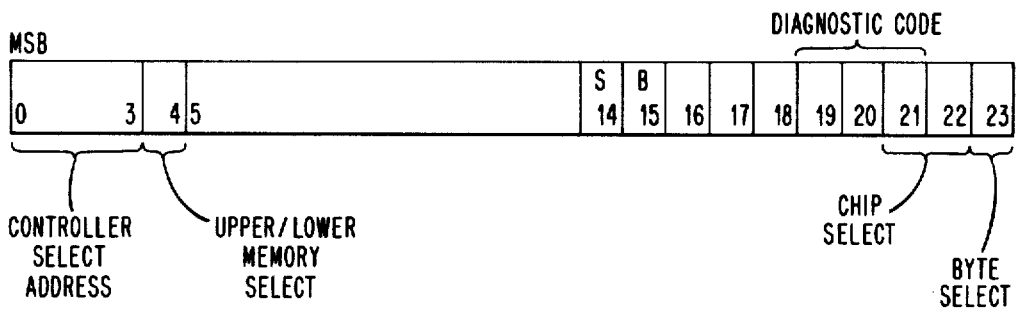

FIG. 9b illustrates the format of the memory address applied to the controller as part of a diagnostic command. As in the case of a read or write, bits 0–4 are processed by the controller 200. Address bits 19, 20, and 21 define the type of diagnostic operation to be performed. As shown, the diagnostic code 010 causes the controller 200 to be placed in an EDAC test mode. As explained herein, in response to this code, the controller 200 reads out the contents of the location being addressed and transfers the contents to the bus. While in this mode, the controller 200 inhibits the generation of BSREDD and BSREDR signals during read cycles and forces the check bit signals to ZEROS during write cycles.

A diagnostic code of 011 causes the controller 200 to reset the EDAC mode. In response to this code, the controller 200 clears status and EDAC check bit indicators and reads the contents of the location being addressed and transfers the contents to the bus.

The last diagnostic code 110 which is the most pertinent to the present invention defines different modes of operation for the soft error rewrite control section 214. When this code is received, bits 14 and 15 are interpreted as defining the operating speed of the soft error rewrite control section and its operational status, respectively. As explained herein, when this diagnostic code is received, controller 200 reads the contents of the location being addressed and transfers the contents to the bus during the second half of a bus cycle. It also modifies the operation of the soft error rewrite control section in the manner specified by bits 14 and 15.

FIG. 8a illustrates diagrammatically the different timing signals involved during the execution of a refresh cycle of operation by the refresh circuits of section 205 of FIG. 1. As previously discussed, these circuits take the form of the circuits disclosed in U.S. Pat. No. 4,185,323. The circuits 205 provide a means of substituting a refresh cycle of operation. This occurs when the controller 200 is not in the process of executing a memory cycle, not anticipating any memory cycle or not requesting a cycle. It will be appreciated that refresh cycles are distributed over a four millisecond interval specified for refreshing the total number of rows/columns of the memory system. In the case of a 64K MOS chip, 256 cycles are required to refresh all of the cells of the entire chip. In the present system, a refresh cycle of operation is started every 15 microseconds by the 30 nanosecond width pulse signal CORREF000. This signal, in turn, causes the generation of a 150 nanosecond fine refresh timing pulse signal FINREF000. The signal FINREF000 causes the switching of a refresh command flip-flop to a binary ONE. As seen from FIG. 8a, this results in signal REFCOM010 being forced to a binary ONE. Thus, the complement of the refresh command signal REFCOM000 switches to a binary ZERO.

Referring to FIG. 2, it is seen that signal REFCOM000 causes NAND gate 207-49 to force refresh signal MREFCT000 to a binary ZERO. When the binary ZERO signal is applied to the output control (OC) terminal of the refresh address register 207-42, this causes the register 207-42 to apply the refresh address contents to the odd and even stack units 210-20 and 210-40 of FIG. 7. Simultaneously, refresh command signal REFCOM100 conditions the timing circuits 204 of FIG. 3 for generating row address timing signals MRASTE010 and MRAST0010. At this time, signal REFCOM100 effectively overrides the state of least significant address bit LSAD22. Also, from FIG. 2, it is seen that signal REFCOM100 while a binary ZERO causes AND gate 207-39 to force signal OCRDEC000 to a binary zero. This overrides all of the decoded row strobe signals so that all of the row address strobe signals DRAST0010 through DRAST7010 are forced to binary ONES. This loads the refresh address contents into each of the rows of RAM chips of FIG. 7.

The result is that a row within each row of RAM chips included within the units 210-20 and 210-40 of FIG. 7 are refreshed as a consequence of a read operation being performed on the addressed 8 rows of RAM chip locations. That is, the signals MEREAD010 and MOREAD010 from section 208 are binary ZEROS which cause the RAM chips of FIG. 7 to perform a read cycle of operation. That is, refresh command signal REFCOM110 caused the circuits of FIG. 5 to maintain signals MEREAD010 and MOREAD010 at binary ZEROS. Prior to that, signal MEMBUZ000 was a binary ONE which forced signals MEREAD010 and MOREAD010 to binary ZEROS.

It will also be noted from FIG. 3 that refresh command signal REFCOM100 inhibits the generation of the CAS timing signal and signals MDOECT000 and MDOOCT000. This prevents information to be written into locations within the stack units 210-20 and 210-40 as well as the read out of information to the output registers 206-8 and 206-10 of FIG. 1.

The end of the refresh cycle of operation is signalled by the leading edge of pulse signal REFRES000 which resets the refresh command flip-flop to a binary ZERO. This, in turn, forces signal REFCOM010 to a binary ZERO. At the trailing edge of signal REFCOM010, the AND gate 207-68 of FIG. 2 forces signal RADDUC000 from a binary ZERO to a binary ONE which, in turn, increments by one, the address contents of refresh counter 207-60. This address change is transferred to refresh address register 207-42 as shown in FIG. 8a by the change in signal MADDXX.

Figure 8B:
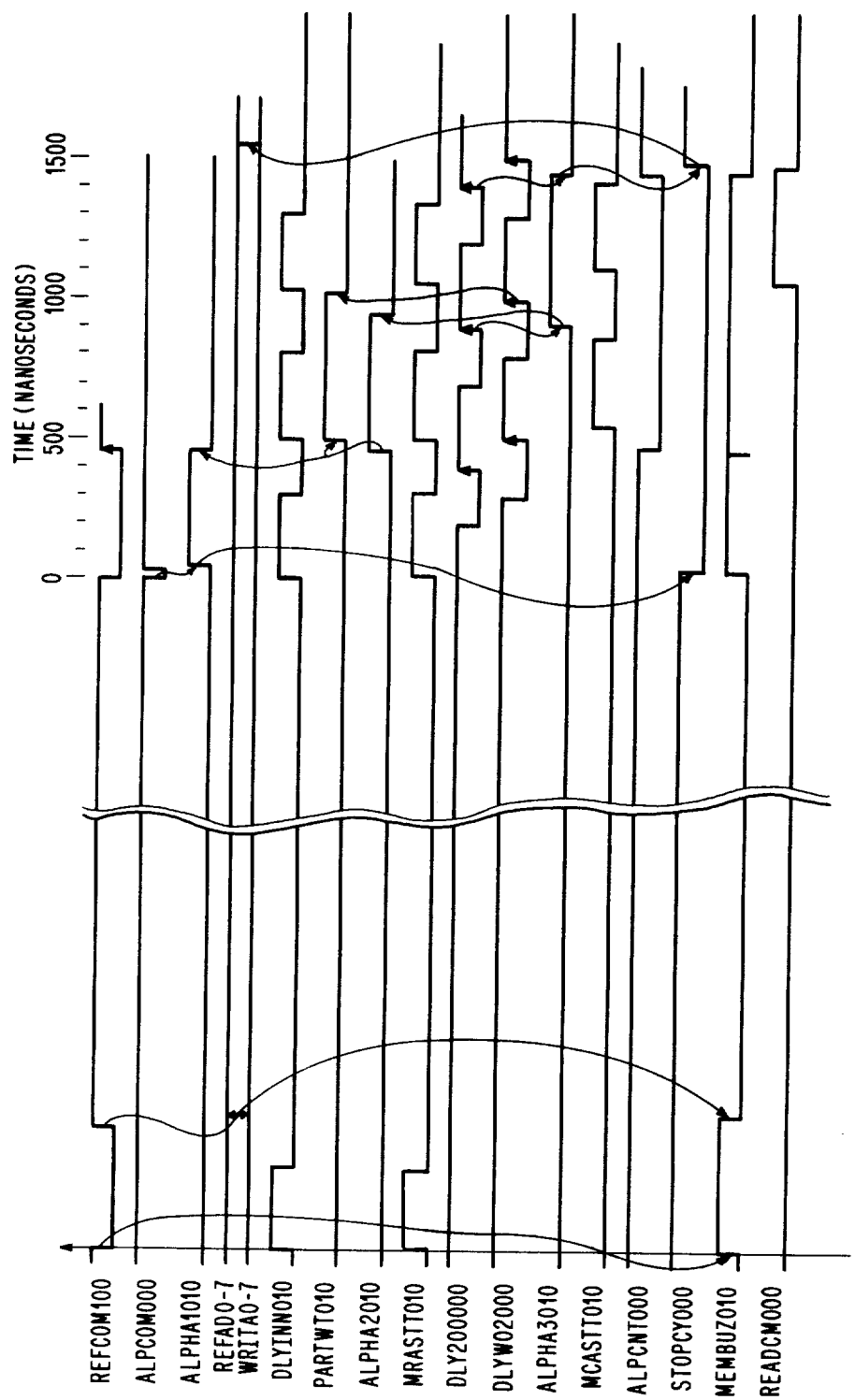

FIG. 8b is used to explain the operation of the soft error rewrite control section 214 in carrying a normal cycle of operation. This operation is provided by extending the refresh and initialize cycles of operation so as to minimize the amount of logic circuits added to the controller 200.

Whereas the initialize mode occurs only during powering up the controller, a soft error rewrite cycle occurs in synchronism with a refresh cycle of operation. The frequency of occurrence of the cycle is established by signal ALPCOM000. When this signal is forced to a binary ZERO by all ONES input from counters 214-10, 214-12, and 214-14, two things occur. One is that the counters 214-10, 214-12, and 214-14 are reset to start counting from ZERO by signal ALPSET110 being forced to a binary ONE. The other is that the phase 1 flip-flop 214-24 is set to a binary ONE.

As seen from FIG. 8b, the setting of the phase 1 flip-flop 214-24 to a binary ONE causes the stop cycle flip-flop 214-27 to switch to a binary ONE. For the purposes of the present invention, this signal indicates the occurrence of a soft error rewrite cycle and its duration.

The phase 1 flip-flop 214-24 defines the period or interval during which a normal refresh cycle takes place. This cycle is carried out in the manner discussed with reference to FIG. 8a. Upon the completion of the refresh cycle, the memory busy signal MEMBUZ000 is forced to a binary ONE. This switches the phase 2 flip-flop 214-25 to a binary ONE. This causes signal ALPHA2000 to reset phase 1 flip-flop 214-24 to a binary ZERO. Normally, as seen from FIG. 8b, the refresh and write counter circuits are incremented at the end of a refresh cycle. However, since a soft error rewrite cycle is being performed at this time, the setting of the stop cycle flip-flop 214-27 forces up count signal ALPHUC010 to a binary ONE. This, in turn, causes the AND gate 207-65 of FIG. 2 to force signal INITUC000 to a binary ONE causing signal RADDUC000 to be forced to a binary ONE. This prevents the incrementing of the refresh and write counters at this time.

As seen from FIG. 8b, the setting of phase 2 flip-flop 214-24 causes partial write flip-flop 208-16 of FIG. 5 to switch to a binary ONE. That is, signal ALPHA2000, when switched to a binary ZERO, forces signal BYWRIT010 to a binary ONE. NAND gate 208-19 forces signal PWTSET100 to a binary ZERO upon the occurrence of signal MPULSE010. This forces signal PWTSET000 to a binary ZERO which enables flip-flop 208-16 to switch to a binary ONE state. The setting of the partial write flip-flop 208-16 signifies that the timing generator circuits 204 will generate two sequences of timing signals, one for a read cycle followed by a write cycle. When the flip-flop 208-16 switches to a binary ONE, it causes read command signals MEREAD010 and MOREAD10 to be forced to binary ZEROS.

As seen from FIG. 4, signal ALPCNT000 is switched to a binary ZERO when the phase 2 flip-flop 214-25 switches to a binary ONE. This signal causes the multiplexer circuit 207-14 of FIG. 2 to select as a source of address signals, the signals ARAD21010 and ARADX6010 from the counter 207-64. As seen from FIG. 2, least significant address bit LSAD22 is forced to a binary ZERO. This effectively eliminates bit LSAD22 causing a double word operation beginning with the even stack units 210-20 so as to take advantage of the address decode arrangement of FIG. 2. Bits 21 and X6 specify the contents of which word locations in stack units 210-20 and 210-40 are to be read out to data registers 206-8 and 206-10. These bits together with bit 22 are decoded by decoder circuits 207-20 and 207-31 and force the appropriate decode row address strobe signals to binary ONES.

Also, signal ALPCNT010 is switched to a binary ONE when phase 2 flip-flop 214-25 is switched to a binary ONE. This signal conditions the timing circuits 204 of FIG. 3 so as to enable the generation of timing signals for cycling both stack units 210-20 and 210-40 during a read cycle of operation. That is, signal ALPCNT010 forces signal RASINH010 to a binary ZERO. This, in turn, causes NAND gates 204-8 and 204-14 to force signals ERASIH000 and ORASIH000 to binary ONES which enables timing signals MRASTE010 and MRAST0010 to be applied to the even and odd stack units 210-20 and 210-40. Also, the AND gates 204-11 and 204-15 are conditioned to apply subsequently timing signals MDOECT010 and MDOOCT010 to the even and odd registers 206-8 and 206-10.

The read operation is performed upon the pair of locations specified by the refresh and write address counters. That is, the address contents of the refresh and write address counters 207-60 through 207-63 are fed into the refresh address and write address registers 207-42 and 207-43, respectively. As seen from FIG. 8b, signal MEMBUZ010 remains a binary ONE during the entire rewrite cycle of operation.

As seen from FIG. 2, signal ALPCNT000 enables the storage of the row address signals by causing AND gate 207-48 to force signal INTREF200 to a binary ZERO. This, in turn, causes NAND gate 207-49 to force signal MREFCT000 to a binary ZERO which enables the address contents of refresh address register 207-42 to be applied to the odd and even stack units 210-20 and 210-40. The row address signals are stored in the RAM chips of FIG. 7 in the pair of rows specified by the outputs from decoder circuits 207-20 and 207-31. These row address signals are stored in response to even and odd row address strobe signals MRASTE010 and MRASTO010 generated in response to row address timing signal MRASTT010.

In a similar fashion, the column address signals which correspond to the address contents of the write address register 207-43 are stored in all of the RAM chips. More specifically, signal MCASTT010 from timing generator 204 and signal INITAL110 cause NAND gate 207-51 of FIG. 2 to force signal MWRTCT000 to a binary ZERO. This conditions the write address register 207-43 to apply its address contents to the stack units 210-20 and 210-40. These signals are stored in the RAM chips of FIG. 7 in response to column address signal MCASTS010.

The switching of phase 2 flip-flop 214-25 causes the switching of the partial write flip-flop 208-16 to a binary ONE state. This defines the read operation of the cycle by forcing the signal READCM000 to a binary ZERO. Signal READCM000 is a binary ZERO at this time which, in turn, causes signals MEREAD010 and MOREAD010 to be binary ZEROS. Therefore, the RAM chips of the selected pair of rows are conditioned to perform a read operation wherein their contents are read out into the even and odd data registers 206-8 and 206-10 which have been enabled by signals MDOECT0010 and MDOOCT0010, respectively. At this time, read command signal READCM000 holds signal MDRELB000 at a binary ONE. This inhibits the contents of the right most sections of registers 206-8 and 206-10 from being applied at the outputs thereof. Also, read command signal READCM000 causes the circuits 204 to force signal MDOTSC100 to a binary ZERO and signal MDOTSC010 to a binary ONE. This inhibits the contents of the left most sections of registers 206-8 and 206-10 from being applied to the inputs thereof. At the same time, the read out word contents, stored in the middle sections of registers 206-8 and 206-10, are applied to EDAC circuits 206-12 and 206-14.

During the read cycle of operation, the words read out from the pair of locations are checked for errors by the error detection circuits included within the EDAC circuits 210-12 and 210-14. Any single bit errors located within the words are corrected by the error correction circuits included with the EDAC circuits 210-12 and 210-14. Since signal PARTWT010 is a binary ONE, the corrected words are loaded into the rightmost sections of registers 206-8 and 206-10 and rewritten back into stack units 210-20 and 210-40 during the interval defined by the next occurrence of signal MCASTT010 of FIG. 8c.

Where more than one error is detected to have occurred within a word, this causes one of the EDAC circuits 206-12 and 206-14 to force signal MDIEWE010 or signal MDIOWE010 to a binary ONE state. This, in turn, sets the even abort write flip-flop 208-44 or odd abort write flip-flop 208-45 of FIG. 5 to a binary ONE state when partial write signal switches from a binary ZERO to a binary ONE state. As explained herein, this aborts the write operation thereby preserving the error status of the original information.

When the timing generator 204 generates signal RESET010, the phase 3 flip-flop 214-26 is conditioned by the binary ONE state of signal ALPHA2010 to switch to a binary ONE. As seen from FIG. 8b, the phase 2 flip-flop 214-25 is reset to a binary ZERO by AND gate 214-31 of FIG. 4. The switching of the phase 3 flip-flop 214-26 initiates a second sequence of timing signals required for performing a write cycle of operation. Since signal ALPUC010 is still a binary ONE (i.e., the stop cycle flip-flop 214-27 is still a binary ONE), this inhibited the incrementing of the refresh, write and decode address counters 207-60 through 207-64 by signal RADDUC000. Hence, the write operation is performed upon the same pair of locations within the stack units 210-20 and 210-40. In the manner just described, the same row and column address signals are caused to be stored in the RAM chips of the two rows specified by the address bit signals ARAD21010 and ARADX6010.

Briefly, as seen from FIG. 4, the states of signals ALPCNT000 and ALPCNT010 remain the same as a consequence of the phase 3 flip-flop 214-26 being switched to a binary ONE. Accordingly, the row address contents of the refresh address register 207-42 are applied to the stack units 210-20 and 210-40 and stored in the RAM chips of the same two rows addressed during the prior read cycle of operation in response to signal MRASTT010.

In a similar fashion, the column address contents of write address register 207-43 are applied to the stack units 210-20 and 210-40 and stored in the RAM chips of FIG. 7, in response to signal MCASTT010.

As seen from FIG. 8b, during the write cycle, the timing generator circuits 204 repeat the generation of the same sequence of timing signals which cause the contents of the addressed pair of storage locations to be read out into registers 206-8 and 206-10. At this time, partial write signal PARTWT010 is a binary ZERO. That is, the partial write flip-flop 208-16 is reset to a binary ZERO in response to timing signal DLYW0200 since at that time signal ALPHA2000 is a binary ONE.

Since read command signal READCM000 and signal ALPCNT010 are binary ONES, this causes NAND gate 214-39 of FIG. 4 to force signal MDRELB000 to a binary ZERO. This enables the right most sections of registers 206-8 and 206-10 containing the corrected word pair to apply its contents to the outputs thereof. At the same time, signals READCM000 and ALPCNT000 force signals MDOTSC100 and MDOTSC010 to binary ONES. This inhibits the left most and middle sections of registers 206-8 and 206-10 from applying signals at the outputs thereof during this interval.

Accordingly, the contents of the pair of addressed storage locations previously read out into the right most sections of registers 206-8 and 206-10 are written back into the addressed storage locations.

Accordingly, any single bit errors occurring within either one or both of the words read out will have been corrected utilizing the error detection and error correction circuits included within the system. Thus, any soft errors are eliminated from the pair of words accessed which, in turn, prevents such errors from turning into double errors which are not correctable.

However, when a double error condition is detected, the occurrence of the condition is stored and causes the write operation to be aborted. That is, in such instances, either signal EWRITA000 or signal OWRITA000 or both are forced to a binary ZERO. This, in turn, causes AND gate 208-23 or AND gate 208-25 to force a corresponding one of the signals MEREAD010 or MOREAD010 to a binary ZERO. This, in turn, inhibits the writing of the uncorrectable words into the corresponding one(s) of the addressed pair of locations. As mentioned, this perserves the error condition within the uncorrectable word. As seen from FIG. 8b, the resetting of the phase 3 flip-flop 214-26 to a binary ZERO state causes the stop cycle flip-flop 214-27 to reset to a binary ZERO. This signifies the end of the soft error rewrite cycle of operation. As previously discussed, the phase 3 flip-flop 214-26 is reset to a binary ZERO in response to signal RRESET010 from the timing circuits 204.

When the stop cycle flip-flop 214-27 resets, this causes OR gate 214-34 to switch up count signal ALPHUC010 from a binary ONE to a binary ZERO. As seen from FIG. 8b, this causes the read address and write address counters 207-60 through 207-63 in addition to the decode address counter 207-64 to be incremented by one. That is, signal ALPHUC010 causes increment signal RADDUC000 to switch from a binary ONE to a binary ZERO. This results in updating the counters at the end of the soft error rewire cycle.

The counters 214-10, 214-12 and 214-14 continue to operate in synchronism with refresh cycles. Following the occurrence of another 2047 refresh cycles, NAND gate 214-16 again forces command signal ALPCOM000 to a binary ZERO signalling the start of another soft error rewrite cycle. By synchronizing the counters on an odd count, which is one less than the maximum count of 2048 (i.e., $2^{11} - 1$), this selects a sequence of address values stored in the refresh, write and decode address counters 207-60 through 207-64 which select every location within stack units 210-20 and 210-40.

It can be seen that during normal operation, the soft error rewrite control circuits of section 214 operate over a long period of time to read out check/correct and rewrite the contents of all of the pairs of locations of the stack units 210-20 and 210-40. This is desirable in order to minimize interference with normal memory operations. However, in the case of diagnostic operations, it becomes desirable to be able to carry out such operations within a minimum of time and with a minimum of additional apparatus. Utilizing the diagnostic mode control circuits of section 216, test and verification operations can be performed within a minimum of time upon the soft error rewrite control circuits of section 214 in response to several diagnostic commands received from an external source (e.g. CPU) via the bus.

It will be assumed that the operation of the different portions of the controller 200 have been tested and verified. For example, these include the stack units 210-20 and 210-40, the data paths and EDAC circuits 206-12 and 206-14. Such testing for the purposes of the present invention can be considered to have been carried out in a conventional manner and do not form a part of this invention.

Following such testing, a sequence of diagnostic command codes are forwarded to the controller 200 which enable testing and verification of section 214. A first diagnostic command code received has the value "110" and bit 15 set to a binary ONE. At the time of transfer of the diagnostic command code, as well as other diagnostic command codes, the signal applied to line BSYELO is forced to a binary ONE while line BSWRIT remains a binary ZERO. The line BSYELO is used to signal memory controller 200 that the memory address being applied to lines BSAD00-23 includes a diagnostic command code.

As seen from FIG. 5, the binary ONE signal BSYEL010 upon being stored in register 208-10, in response to signal MYACKR010, forces signal LSYEL0010 to a binary ONE. This enables decoder circuit 216-12, since it will be assumed that signal LSWRIT010 is a binary ZERO (i.e., the signal applied to line BSWRIT was a binary ZERO indicative of a read operation).

In response to a code of 110, a decoder circuit 216-2 forces signal ALPRFC000 to a binary ZERO. This results in bypass flip-flop 216-20 being switched to a binary ONE state in response to signal BSAD15210. The flip-flop 216-20 forces signal ALPABY100 to a binary ZERO which switches the soft error rewrite control circuits of FIG. 4 to an inoperative state. That is, referring to FIG. 4, it is seen that signal ALPABY100 when a binary ZERO holds NAND gate 214-16 in a binary ONE state. This, in turn, maintains signal ALPSET110 in a binary ZERO state. Since the controller 200 is not in a test mode, signal TESTMM010 is a binary ZERO while signal TESTMM100 is a binary ONE. Therefore, signals TESTMM010 and ALPSET110 cause NAND gates 214-20 and 214-21 to force signals, ALPCOM200 and ALPCOM100 to binary ONES. This, in turn, inhibits AND gate 214-22 from forcing signal EALPST000 to a binary ZERO thereby inhibiting a soft error rewrite cycle.

In response to the read command, the circuits of section 208 force signals MEREAD010 and MOREAD010 to binary ZEROS which enable the contents of the pair of locations specified by the address signals loaded into registers 207-40 and 207-41 of FIG. 2 to be read out into registers 206-8 and 206-10 and transferred via the sets of lines MUXD00-15 and MUXD16-31 to the bus. For further information regarding the transfer, reference may be made to the copending patent application of Robert B. Johnson, et al., titled "Sequential Word Aligned Address Apparatus", Ser. No. 110,521, filed on Jan. 8, 1980, and assigned to the same assignee as named herein.

The second diagnostic command code transferred to controller 200 has the value "010". At the time of transfer, again the signal applied to the BSYELO line is forced to a binary ONE while the line BSWRIT is forced to a binary ZERO.

As seen from FIG. 5, the signals applied to lines BSYELO and BSWRIT are stored in register 208-10 in response to signal MYACKR010. The decoder circuit 216-2 of FIG. 6 in response to the value "010" is operative to force signal SETEDA000 to a binary ZERO. This causes the EDAC mode flip-flop 216-10 to be switched to a binary ONE upon the occurrence of timing signal PULS20210.

As seen from FIG. 6, the flip-flop 216-10 switches signal EDACM0000 to a binary ZERO. This causes AND gates 216-14 and 216-16 to force signals EDACCK000 and EDACCK100 to binary ZEROS. The signals EDACCK000 and EDACCK100 inhibit output AND gates within each of the EDAC circuits 206-12 and 206-14 from transferring the generated check bit signals. This results in the sets of check bit signals MDIEC0-05 and MDIOC0-C5 being forced to binary ZEROS. Additionally, signal EDACCK100 is applied to output AND gates within the red and yellow generator circuits 206-20. This inhibits the transfer of error signals MYREDD010 and MYREDR010 to the lines BSREDD and BSREDR.

The memory controller 200 in response to the read command is operative to read out the contents of a pair of locations being addressed to registers 206-8 and 206-10. Thereafter, the register contents are transferred via the sets of lines MUXD00-15 and MUXD16-31 to the bus.

The above command is followed by a series of memory write commands at which time line BSWRIT is forced to a binary ONE. The write commands specify successive memory addresses beginning with a starting address (i.e., an all ZERO address) within the memory controller 200. Each of the series of data patterns applied to the lines BSDT00-BSDT31 is coded so as to contain the same single bit error data bit pattern for each word of the word pair being written into memory at the specified addresses.

For example, one of the following series of data patterns 9–40 may be selected to verify the operation of rewrite control section 214. The following series of data patterns, coded in hexidecimal, are used to verify the operation of the EDAC circuits 206-12 and 206-14.

| PAT-TERN # | WRITE | READ (CORR.) | Y | R | REMARKS |
|---|---|---|---|---|---|
| 1 | 02C8 | 02C8 | 0 | 0 | NORMAL |
| 2 | 0420 | 0420 | 0 | 0 | NORMAL |
| 3 | 0548 | 0548 | 0 | 0 | NORMAL |
| 4 | 0810 | 0810 | 0 | 0 | NORMAL |
| 5 | 1008 | 1008 | 0 | 0 | NORMAL |
| 6 | 2004 | 2004 | 0 | 0 | NORMAL |
| 7 | 4002 | 4002 | 0 | 0 | NORMAL |

-continued

| PAT-TERN # | WRITE | READ (CORR.) | Y | R | REMARKS |
|---|---|---|---|---|---|
| 8 | 8001 | 8001 | 0 | 0 | NORMAL |
| 9 | C002 | 4002 | 1 | 0 | BIT 0 |
| 10 | 0001 | 8001 | 1 | 0 | BIT 0 |
| 11 | 6004 | 2004 | 1 | 0 | BIT 1 |
| 12 | 0002 | 4002 | 1 | 0 | BIT 1 |
| 13 | 3008 | 1008 | 1 | 0 | BIT 2 |
| 14 | 0004 | 2004 | 1 | 0 | BIT 2 |
| 15 | 1810 | 0810 | 1 | 0 | BIT 3 |
| 16 | 0008 | 1008 | 1 | 0 | BIT 3 |
| 17 | 0C20 | 0420 | 1 | 0 | BIT 4 |
| 18 | 0010 | 0810 | 1 | 0 | BIT 4 |
| 19 | 06C8 | 02C8 | 1 | 0 | BIT 5 |
| 20 | 0020 | 0420 | 1 | 0 | BIT 5 |
| 21 | 0748 | 0548 | 1 | 0 | BIT 6 |
| 22 | 00C8 | 02C8 | 1 | 0 | BIT 6 |
| 23 | 03C8 | 02C8 | 1 | 0 | BIT 7 |
| 24 | 0448 | 0548 | 1 | 0 | BIT 7 |
| 25 | 05C8 | 0548 | 1 | 0 | BIT 8 |
| 26 | 0248 | 02C8 | 1 | 0 | BIT 8 |
| 27 | 0460 | 0420 | 1 | 0 | BIT 9 |
| 28 | 0508 | 0548 | 1 | 0 | BIT 9 |
| 29 | 0830 | 0810 | 1 | 0 | BIT 10 |
| 30 | 0400 | 0420 | 1 | 0 | BIT 10 |
| 31 | 1018 | 1008 | 1 | 0 | BIT 11 |
| 32 | 0800 | 0810 | 1 | 0 | BIT 11 |
| 33 | 200C | 2004 | 1 | 0 | BIT 12 |
| 34 | 1000 | 1008 | 1 | 0 | BIT 12 |
| 35 | 4006 | 4002 | 1 | 0 | BIT 13 |
| 36 | 2000 | 2004 | 1 | 0 | BIT 13 |
| 37 | 8003 | 8001 | 1 | 0 | BIT 14 |
| 38 | 4000 | 4002 | 1 | 0 | BIT 14 |
| 39 | 4003 | 4002 | 1 | 0 | BIT 15 |
| 40 | 8000 | 8001 | 1 | 0 | BIT 15 |
| 41 | 0000 | 0000 | 0 | 1 | BITS 0 + 15 |

DATA PATTERN

1 | 0 | 2 | C | 8 |

| 0-3 | 4-7 | 8-11 | 12-15 |
DATA BITS

It will be noted that the first eight data patterns contain no errors. This series of patterns are followed by pairs of patterns nos. 9-40 each of which contain single bit ZERO and ONE errors in the bit positions indicated. Each pair produces a "yellow" error condition. The last all ZERO pattern is used to generate a "red" error condition.

It will be appreciated that during the verification of the EDAC circuits, the operation of the soft error rewrite control circuits is inhibited. The operation of the EDAC circuits 206-12 and 206-14 is verified by issuing a series of read commands. This reads out the memory locations previously written normal data patterns and then error patterns. However, the error patterns remain in memory since the EDAC circuits 206-12 and 206-14 only correct the data as it is being read out. It is seen that if this were done when the soft error rewrite control circuits were not inhibited, erroneous test results would be obtained (i.e., soft error rewrite control circuits would correct any single bit error). Therefore, when EDAC testing is being performed, the soft error rewrite control circuits operation is inhibited.

Continuing on with the discussion of rewrite control section 214 testing, the memory controller 200 in response to a first write command is operative to write a selected single bit error bit data pattern together with the all ZERO check bit signals into the pair of locations specified by the memory address applied to the address lines BSAD00-23. In a similar fashion, the memory controller 200 in response to a next write command writes the same error bit pattern into the next pair of locations. This continues until all of the memory locations contain the same single bit error pattern and all ZERO check bit signals.

Upon the completion of the writing operation, a third diagnostic code having the value "011" is transferred to controller 200. Again the line BSYELO is forced to a binary ONE while line BSWRIT is forced to a binary ZERO. This diagnostic code conditions decoder circuit 216-2 to force signal RESEDA000 to a binary ZERO. The result is that the EDAC mode flip-flop 216-10 is reset to a binary ZERO.

As seen from FIG. 6, the flip-flop 216-10 switches signal EDACM0000 to a binary ONE. This, in turn, causes AND gates 216-14 and 216-16 to switch signals EDACCK000 and EDACCK100 to binary ONES. At this time, EDAC circuits 206-12 and 206-14, in addition to the red and yellow generation circuits 206-20, are again enabled for normal operation. Additionally, status and indicators are cleared at this time. Also, the contents of the addressed pair of locations are read out to registers 206-8 and 206-10 and transferred to the bus.

Since it is assumed that EDAC circuits have been tested and are operating properly, a last diagnostic command code in the sequence forwarded to controller 200 has the value "110". Also, address bits 15 and 14 have the value "01". Again, the lines BSYELO and BSWRIT are forced to a binary ONE and a binary ZERO, respectively. The decoder circuit 216-2 of FIG. 6, in response to the code "110", is operative to force signal ALPRFC000 to a binary ZERO. This causes AND gates 216-19 to force signal ARCCLK010 to a binary ONE in response to timing signal MYDCNN210. Signal ARCCLK010 conditions bypass flip-flop 216-20 and test mode flip-flop 216-22 to switch to a binary ZERO and a binary ONE, respectively, in response to signals BSAD15210 and BSAD14210.

As seen from FIG. 4, signal ALPABY100 which is switched to a binary ONE now enables NAND gate 214-16 for operation. Additionally, flip-flop 216-22 forces signal TESTMM010 to a binary ONE and complement signal TESTMM100 to a binary ZERO. This places the section in a test mode of operation wherein the soft error control circuits of section 214 are conditioned to operate in a high speed mode of operation. That is, signal TESTMM010 enables NAND gate 214-20 while signal TESTMM100 disables NAND gate 214-21.

This means that in response to each refresh command signal REFCOM110, NAND gate 214-20 forces signal ALPCOM200 to a binary ZERO. Thereafter, AND gate 214-22 forces signal EALPST000 to a binary ZERO. This causes phase 1 flip-flop 214-24 to switch to a binary ONE state which initiates a soft error rewrite cycle identical to that shown in FIG. 8b.

During the above mentioned cycle of operation, the single bit error pattern is read out from the pair of addressed locations into the registers 206-8 and 206-10. In the manner previously described, the error patterns are corrected by the EDAC circuits 206-12 and 206-14, stored in the right most sections of the registers 206-8 and 206-10 and thereafter written back into the addressed pair of locations. As in normal operation, the addresses for the addressed pair of locations are specified by the address contents of 207-64 of FIG. 2.

Following the completion of the rewrite cycle, the counters 207-60 through 207-64 are incremented by one.

Thus, while in the test mode of operation, the soft error rewrite control circuits of section 214 are conditioned to operate in exact synchronism with the refresh circuits of section 205. After a predetermined period of time, the contents of all of the pairs of locations should have been rewritten with the corrected information. Of course, this is true only when the soft error rewrite control circuits are operating properly.

The operation of the soft error rewrite control circuits is verified by a further sequence of diagnostic and read commands. In greater detail, another diagnostic code of 110 is transferred to controller 200. This time bits 15 and 14 are set to the value 00. As previously discussed, the value "110" causes decoder circuit 216-2 to switch signal ALPREFC000 to a binary ZERO. This results in bypass mode flip-flop 216-20 being switched to a binary ZERO while test mode flip-flop 216-22 is switched to a binary ZERO. Accordingly, signal ALPABY100 switches to a binary ONE which enables NAND gate 214-16 of FIG. 4. Therefore, the soft error rewrite control circuits are set to normal mode. This readies the memory controller 200 for normal operation.

Next, a series of read memory commands are transferred to controller 200. This causes the contents of each pair of locations to be read out to registers 206-8 206-10. At this time, EDAC circuits 206-12 and 206-14 are operative to check the data patterns for errors.

When soft error rewrite control circuits are operating properly, the EDAC circuits 206-12 and 206-14 operate to detect the absence of single bit errors within the data pattern read out to the registers 206-8 and 206-10. Therefore, signal MYYEL0110 remains a binary ZERO. Accordingly, by monitoring the state of the BSYELO line, the operation of the circuits of section 214 can be verified for this pattern. This is in contrast to the above EDAC testing sequence wherein the EDAC circuits detect the presence of a single bit error which results in signal MYYELO110 being forced to a ONE.

Thereafter, the all ZERO pattern is written into all of the memory locations in the same manner as described above. By monitoring the state of the BSREDD line, the operation of the circuits of section 214 are further verified. This is done by checking that no modification of the all ZERO data pattern has taken place and that an uncorrectable error condition is signalled in each case (i.e., the abort circuits 208-44 and 208-45 of FIG. 5 preserve the original data pattern).

In response to each such read command, the read out data pattern is transferred to the bus via the multiplexer circuits 206-16 and 206-18. Thereafter, any further checking of the corrected data patterns may be performed by the processor. As shown, any single bit error data pattern and a double bit error data pattern may be written into the stack units 210-20 and 210-40 for verifying the operation of the soft error rewrite control circuits of section 214. It will be obvious that the sequence of data patterns and similar sequence of diagnostic commands can be used to verify the operation of the EDAC circuits.

It will be appreciated by those skilled in the art that many changes may be made to the illustrated embodiment. For example, while the various data patterns were shown as being supplied via the bus 10, such data patterns could be provided by apparatus includable within the controller 200. Similarly, the checking operation could be performed within the controller 200.

Additionally, the diagnostic apparatus of the invention may be used with different memory organizations, chips, refresh circuits, etc. It will be also obvious that different types of commands, types of command coding or fewer commands may also be used.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A dynamic semiconductor memory system coupled to a bus for receiving memory commands, said memory system comprising:
   a dynamic memory including a number of addressable arrays in a number of rows and columns;
   error detection and correction circuit means coupled to said memory for detecting and correcting single bit errors in the contents of the cells read out from said memory during a memory cycle of operation;
   timing means for providing sequences of timing signals for performing said memory cycle of operation;
   refresh and write control means coupled to said timing means, said refresh control and write control means, for periodically generating refresh command signals and counting sequentially through all of the row and column addresses at a first predetermined rate in response to signals from said timing means; and,
   rewrite control means coupled to said refresh and write control means and to said timing means, said rewrite control means including counter means and test control means coupled to said counter means and to said refresh and write control means, said counter means being operative in response to said refresh command signals to condition said timing means to perform rewrite cycles of operation at a second predetermined rate which is slower than said first predetermined rate for detection and correction of said single bit errors by said error detection and correction means of the contents of the cells within the rows and columns specified by said refresh and write control means; and,
   diagnostic mode control means coupled to said bus, said error detection and correction means and to said test control means, said diagnostic mode control means being operative in response to a predetermined type of memory command to condition said test control means to cause said rewrite control means to perform rewrite cycles of operation at said first predetermined rate enabling rapid verification of the proper operation of said rewrite control means.

2. The system of claim 1 wherein certain ones of said memory commands includes a diagnostic code defining the diagnostic mode of operation, said diagnostic mode control means including:
   decode circuit means coupled to said bus, said decode circuit means being operative in response to said memory command diagnostic codes to generate output signals defining said diagnostic mode of operation for said memory system; and,
   a number of bistable means coupled to said decode circuit means, a first bistable means of said number of bistable means being conditioned by a different one of said output signals generated in response to a first diagnostic code of a memory command and other bits of said command to switch to a predetermined state for defining a first diagnostic mode of operation, said first bistable means when switched to said predetermined state defining a high speed test and verification mode and said first bistable means being connected to condition said test control means to enable said rewrite control means to perform said rewrite cycles of operation at said first predetermined rate.

3. The system of claim 2 wherein said test control means includes first and second gating means, each having at least a pair of input terminals and an output terminal, one of said pair of input terminals of said first and second gating means being connected to said refresh and write control means for receiving said refresh command signals and to said counter means respectively, the other input terminal of said first and second gating means being coupled to said first bistable means, said output terminals of said first and second gating means being coupled in common, said first bistable means when in said predetermined state conditioning said first gating means to generate signals for performing said rewrite cycles of operation at said first predetermined rate and said first bistable means when in a different state conditioning said second gating means to generate signals for performing said rewrite cycles of operation at said second predetermined rate.

4. The system of claim 3 wherein said counter means includes n number of stages and said rate equals $2^n - 1$ counts.

5. The system of claim 4 wherein n equals 11 and said rate equals 2047 counts.

6. The system of claim 2 wherein a second bistable means of said number of bistable means is conditioned by said different one of said output signals and said other bits of said command to switch to said predetermined state for enabling performance of a second diagnostic mode of operation, said second bistable means being connected in series with said counter means and said test control means and operative when in said predetermined state to inhibit the operation of said rewrite control means thereby enabling the performance of other diagnostic operations.

7. The system of claim 6 wherein said error detection and correction means includes encoder circuit means for generating a group of check code bit signals from the group of data pattern signals to be written into said memory during a memory cycle of operation and wherein a third bistable means of said number of bistable means is conditioned by additional ones of said output signals generated in response to second and third diagnostic codes of said memory commands to switch to said predetermined state and be reset to a state other than said predetermined state respectively, said third bistable means being coupled to said error detection and correction means, said third bistable means when in said predetermined state conditioning said error detection and correction means to force said group of check code bit signals to ZEROS during the writing of said data pattern signals into said memory and said third bistable means when in said state other than said predetermined state enabling said error detection and correction means for normal operation.

8. The system of claim 7 wherein said memory includes a plurality of memory storage locations consisting of said memory cells of said number of addressable arrays and wherein said system receives said data pattern signals coded to include a correctable error pattern for writing into all of said plurality of memory storage locations along with said group of all ZERO check bit signals during successive memory write cycles of operation when said third bistable means is in said predetermined state for verifying the operation of said rewrite control means.

9. The system of claim 8 wherein said third bistable means is in said state other than said predetermined state enabling said error detection and correction means to correct said single bit error pattern signals read out from a different storage location during a rewrite cycle of operation and wherein said first and second bistable means when in said predetermined state and in a state other than said predetermined state respectively enabling said rewrite control means to rewrite the corrected data pattern signals into said different memory storage location during the same rewrite cycle of operation at said first predetermined rate.

10. The system of claim 9 wherein said system further includes error generator circuit means coupled to said error detection and correction means and to said bus, said first and second bistable means when in said state other than said predetermined state conditioning said rewrite control means for normal operation and said error generator circuit means being operative to generate a first predetermined signal on said bus for indicating whether said rewrite control means is operating properly during the read out of said corrected data pattern signals from each of said memory storage locations during subsequent memory read cycles of operation.

11. The system of claim 10 wherein said first predetermined signal defines the absence of a single bit error condition within said corrected data pattern signals stored in said plurality of memory storage locations.

12. The system of claim 8 wherein said memory includes a plurality of memory storage locations consisting of said memory cells of said number of arrays and wherein said system receives said data pattern signals coded to include an uncorrectable error pattern for writing into all of said plurality of memory storage locations along with said group of all ZERO check bit signals during successive memory write cycles of operation when said third bistable means is in said predetermined state.

13. The system of claim 12 wherein said system further includes read/write command control means coupled to said timing means, said refresh and write control means and to said memory, said rewrite control means including cycle phase control means for generating signals defining a sequence of read and write cycles of operation to be performed upon the contents of one of said plurality of storage locations during said rewrite cycle of operation and said system further including read/write command control means coupled to said timing means, said refresh and write control means and said memory, said read/write command control means being conditioned during each rewrite cycle to generate control signals for performing read and write operations upon said contents of one of said plurality of storage locations and said read/write command control means including abort control means coupled to said error detection and correction means, said abort control means being conditioned by a signal from said error detection and correction means indicative of said uncorrectable data pattern signals being read out during the performance of a read operation to inhibit the performance of said write operation during the same rewrite cycle for preserving said uncorrectable data pattern signals within said memory.

14. The system of claim 13 wherein said third bistable means is in said state other than said predetermined state enabling said error detection and correction means to correct said uncorrectable error pattern signals read out from a different storage location during a rewrite cycle of operation and wherein first and second bistable means when in said predetermined state and in a state other than said predetermined state respectively enabling said rewrite control means to rewrite the corrected data pattern signals into said different memory storage location during the same rewrite cycle of operation at said first predetermined rate except when said write operation is inhibited by said abort control means.

15. The system of claim 14 wherein said system further includes error generator circuit means coupled to said error detection and correction means and to said bus, said first and second bistable means when in said state other than said predetermined state conditioning said rewrite control means for normal operation and said error generator circuit means being operative to generate a second predetermined signal on said bus for indicating whether said rewrite control means is operating properly during the read out of said uncorrectable data pattern signals from each of said memory storage locations during subsequent memory read cycles of operation.

16. The system of claim 15 wherein said second predetermined signal defines the presence of an uncorrectable error condition within said uncorrectable data pattern signals stored in said plurality of memory storage locations.

17. The system of claim 9 wherein said system further includes a plurality of manual switching means corresponding in number to said number of bistable means, a different one of said plurality of switching means being connected to said test control means, said counter means and said error detection and correction means in parallel with said first, second and third bistable means, each of said plurality of switching means when placed in a first predetermined position being operative to generate an output signal for placing said memory in the same mode as defined by the bistable means associated therewith.

18. A dynamic semiconductor memory system coupled to a bus for receiving memory commands, said memory system comprising:
a dynamic memory including a number of addressable storage locations;
error detection and correction circuit means coupled to said memory for detecting and correcting errors in the contents of the cells read out from said memory during a memory cycle of operation;
timing means for providing sequences of timing signals for performing said memory cycle of operation;
refresh and write control means coupled to said timing means, said refresh and write control means for periodically generating refresh command signals and generating row and column addresses for accessing different ones of said storage locations at a fast rate in response to signals from said timing means;
rewrite control means coupled to said refresh and write control means and to said timing means, said rewrite control means including counter means operative in response to a predetermined number of said refresh command signals to condition said timing means to perform rewrite cycles of operation at a slow rate for detection and correction of a correctable error pattern by said error detection and correction means within an accessed storage location; and,
diagnostic control means coupled to said bus, said error detection and correction means and to said rewrite control means, said diagnostic control means being operative in response to a predetermined type of memory command to condition said rewrite means to perform rewrite cycles of operation at said first predetermined rate enabling its rapid verification.

19. The system of claim 18 wherein said rewrite control means further includes test control circuit means coupled to said counter means and said diagnostic control means, said diagnostic control means including:
decode circuit means coupled to said bus, said decode circuit means being operative in response to each of said memory commands coded to include diagnostic codes to generate output signals defining a different diagnostic mode of operation for said memory system; and,
a number of bistable means coupled to said decode circuit means, a first bistable means of said number of bistable means being conditioned by a different one of said output signals generated in response to a first diagnostic code of a memory command and other bits of said command to switch to a predetermined state for defining a diagnostic mode of operation, said first bistable means when switched to said predetermined state defining a high speed test and verification mode and said first bistable means being connected to condition said test control means to enable said rewrite control means to perform said rewrite cycles of operation at said high rate.

20. The system of claim 19 wherein said test control means includes first and second gating means, each having at least a pair of input terminals and an output terminal, one of said pair of input terminals of said first and second gating means being connected to said refresh and write control means for receiving said refresh command signals and to said counter means respectively, the other input terminal of said first and second gating means being coupled to said first bistable means and said output terminals of said first and second gating means being coupled in common, said first bistable means when in said predetermined state conditioning said first gating means to generate signals for performing said rewrite cycles of operation at said first predetermined rate and said first bistable means when in a different state conditioning said second gating means to generate signals for performing said rewrite cycles of operation at said second predeterminned rate.

21. The system of claim 20 wherein said counter means includes n number of stages and said rate equals $2^n - 1$ counts.

22. The system of claim 21 wherein n equals 11 and said rate equals 2047 counts.

23. The system of claim 19 wherein a second bistable means of said number of bistable means is conditioned by said different one of said output signals and said other bits of said command to switch to said predetermined state for enabling performance of a second diagnostic mode of operation, said second bistable means being connected in series with said counter means and said test control means and operative when in said predetermined state to inhibit the operation of said rewrite control means thereby enabling the performance of other diagnostic operations.

24. The system of claim 23 wherein said error detection and correction means includes encoder circuit means for generating a group of check code bit signals from the group of data pattern signals to be written into said memory during a memory cycle of operation and wherein a third bistable means of said number of bistable means is conditioned by additional ones of said output signals generated in response to second and third diagnostic codes of said memory commands to switch to said predetermined state and be reset to a state other than said predetermined state respectively, said third bistable means being coupled to said error detection and correction means, said third bistable means when in said predetermined state conditioning said error detection and correction means to force said group of check code bit signals to ZEROS during the writing of said data pattern signals into said memory and said third bistable means when in said state other than said predetermined state enabling said error detection and correction means for normal operation.

25. The system of claim 24 wherein said system receives said data pattern signals coded to include a correctable error pattern for writing into all of said plurality of memory storage locations along with said group of all ZERO check bit signals during successive memory write cycles of operation when said third bistable means is in said predetermined state for verifying the operation of said rewrite control means.

26. The system of claim 25 wherein said third bistable means is in said state other than said predetermined state enabling said error detection and correction means to correct said correctable error pattern read out from a different storage location during a rewrite cycle of operation and wherein first and second bistable means when in said predetermined state and in a state other than said predetermined state respectively enabling said rewrite control means to rewrite the corrected data pattern signals into said different memory storage location during the same rewrite cycle of operation at said first predetermined rate.

27. The system of claim 26 wherein said system further includes error generator circuit means coupled to said error detection and correction means and to said bus, said first and second bistable means when in said state other than said predetermined state conditioning said rewrite control means for normal operation and said error generator circuit means being operative to generate a first predetermined signal on said bus for indicating whether said rewrite control means is operating properly during the read out of said corrected data pattern signals from each of said memory storage locations during subsequent memory read cycles of operation.

28. The system of claim 27 wherein said first predetermined signal defines the absence of a correctable error condition within said corrected data pattern signals stored in said plurality of memory storage locations.

29. A memory controller coupled to a bus for receiving predetermined sequences of memory commands, certain ones of said memory commands including a diagnostic code defining a diagnostic mode of operation and a number of bits defining the type of diagnostic operation to be performed, said memory controller comprising:

a dynamic memory including a number of memory module units, each unit having a plurality of word storage locations;

error detection and correction circuits coupled to each of said memory module units for detecting and correcting errors in a corresponding number of word storage locations accessed from said units during a memory cycle of operation;

timing means for providing sequences of timing signals for performing said memory cycle of operation;

refresh and write control means coupled to said timing means, said refresh and write control means for periodically generating refresh command signals and row and column addresses at a first predetermined rate in response to signals from said timing means;

rewrite control means coupled to said refresh and write control means and to said timing means, said rewrite control means including a counter and test mode control circuits coupled in series with said counter and to said refresh and write control means, said counter being operative in response to the occurrence of a predetermined number of said refresh command signals to condition said timing means to perform rewrite cycles of operation at a second predetermined rate which is must slower than said first predetermined rate for detection and correction of any correctable bit errors by said error detection and correction circuits in said pair of word storage locations specified by said row and column addresses; and, diagnostic mode control means coupled to said bus, said error detection and correction means and to said test mode control circuits, said diagnostic mode control means being operative in response to said predetermined sequence of commands to condition said test mode control circuits, said error detection and correction means and said rewrite control means to write predetermined test data patterns including groups of check code bits in all of said plurality of said storage locations of said units and to enable said rewrite control means to perform rewrite cycles of operation at said first predetermined rate upon said predetermined test data patterns for verifying that said rewrite control means is operating properly.

30. The controller of claim 29 wherein said diagnostic mode control means includes:

a decoder circuit coupled to receive signals representative of said diagnostic code from said bus, said decoder circuit being operative in response to said diagnostic code to generate an output signal defining said diagnostic mode of operation for said controller; and, a plurality of bistable circuits coupled to said decoder circuit, a first bistable circuit being connected to said error detection and correction circuits for establishing an error detection and correction (EDAC) test mode, a second bistable circuit being connected in series with said counter and test mode circuits for establishing a bypass mode and a third bistable circuit being connected to said test mode circuit for establishing a high speed test and verification mode.

31. The controller of claim 30 wherein said error detection and correction means includes encoder circuit means for generating said groups of check code bits from the test data pattern to be written into said memory during a memory write cycle of operation and wherein said decoder circuit in response to said diagnostic code of a first memory command is operative to generate a first output signal for switching said first bistable circuit to a first state defining said EDAC test mode, said first bistable circuit conditioning said EDAC circuits to force each of said groups of check code bits to ZEROS during the storage of said predetermined test data patterns in said storage locations of said units.

32. The controller of claim 31 wherein said decoder circuit in response to said diagnostic code of a second memory command applied to said bus following the storage of said predetermined test data patterns is operative to generate a second output signal for switching said first bistable circuit from said first state to a second state for enabling said EDAC circuits for normal operation and said decoder circuit in response to said diagnostic code of a third memory command being operative to generate a third output signal for switching each of said second and third bistable circuits to said first state in accordance with the state of a different bit of said number of bits of said third command.

33. The controller of claim 32 wherein said second bistable circuit is conditioned by said state of said different bit to be set to said second state enabling said rewrite control means for operation and said third bistable circuit being conditioned by said state of said different bit to be set to said first state for conditioning said test mode control circuits for said high speed test and verification mode of operation enabling said rewrite control means to perform said rewrite cycles of operation upon said predetermined test data patterns at said first predetermined rate.

34. The controller of claim 33 wherein said test mode control circuits include first and second gating means, each having at least a pair of input terminals and an output terminal, one of said pair of input terminals of said first and second gating means being connected to said refresh and write control means for receiving said refresh command signals and to said counter respectively, the other input terminal of said first and second gating means being coupled to said third bistable circuit and said output terminals of said first and second gating means being coupled in common, said third bistable circuit when in said first state conditioning said first gating means to generate signals for performing said rewrite cycles of operation upon said test data patterns at said first predetermined rate and said third bistable circuit when in said second state conditioning said second gating means to generate signals for performing said rewrite cycles of operation upon said test data patterns at said second predetermined rate.

35. The controller of claim 34 wherein said test data patterns are coded to include single bit correctable errors and said rewrite control means when operating properly is operative during each rewrite cycle of operation to write corrected versions of said test data patterns into said number of word storage locations.

36. The controller of claim 35 wherein said controller further includes error generator circuits coupled to said EDAC circuits, and to said bus, said error generator circuits being operative to generate a first predetermined signal on said bus for indicating whether said rewrite control means is operating properly during the read out of said corrected test data patterns from each of the word storage locations of said units during subsequent memory read cycles of operation.

37. The controller of claim 36 wherein said first predetermined signal indicates the absence of a single bit error.

38. The controller of claim 36 wherein said test data patterns are coded to include double bit uncorrectable errors in lieu of correctable errors, said rewrite control means when operating properly being operative during each rewrite cycle of operation to retain said test data patterns with uncorrectable errors in said number of word storage locations and said error generator circuits being operative to generate a second predetermined signal on said bus for indicating said proper operation during the read out of said uncorrectable test data patterns from each of the word locations during subsequent memory read cycles of operation.

39. The controller of claim 38 wherein said second predetermined signal indicates the presence of a double bit error.

40. The controller of claim 32 wherein said second bistable circuit is conditioned by said state of said different bit to be set to said first state disabling said rewrite control means for operation thereby enabling the operation of said EDAC circuits to be verified using different series of said test data patterns.

* * * * *